United States Patent
Xiao et al.

(10) Patent No.: US 10,832,711 B2
(45) Date of Patent: Nov. 10, 2020

(54) BETA TUNGSTEN THIN FILMS WITH GIANT SPIN HALL EFFECT FOR USE IN COMPOSITIONS AND STRUCTURES WITH PERPENDICULAR MAGNETIC ANISOTROPY

(71) Applicant: BROWN UNIVERSITY, Providence, RI (US)

(72) Inventors: Gang Xiao, Barrington, RI (US); Qiang Hao, Sugar Land, TX (US)

(73) Assignee: BROWN UNIVERSITY, Providence, RI (US)

( * ) Notice: Subject to any disclaimer, the term of this patent is extended or adjusted under 35 U.S.C. 154(b) by 0 days.

(21) Appl. No.: 16/221,901

(22) Filed: Dec. 17, 2018

(65) Prior Publication Data
US 2019/0139568 A1    May 9, 2019

Related U.S. Application Data

(63) Continuation of application No. 15/498,685, filed on Apr. 27, 2017, now Pat. No. 10,157,633, which is a
(Continued)

(51) Int. Cl.
*G11B 5/37* (2006.01)
*H01F 10/30* (2006.01)
(Continued)

(52) U.S. Cl.
CPC .............. *G11B 5/37* (2013.01); *H01F 10/30* (2013.01); *H01F 10/329* (2013.01); *H01L 43/10* (2013.01);
(Continued)

(58) Field of Classification Search
None
See application file for complete search history.

(56) References Cited

U.S. PATENT DOCUMENTS 3,463,636 A    8/1969    Ogren
4,999,049 A    3/1991    Balderson et al.
(Continued)

FOREIGN PATENT DOCUMENTS

WO    2014/025838 A1    2/2014

OTHER PUBLICATIONS

Pai et al., Enhancement of perpendicular magnetic anisotropy and transmission of spin-Hall-effect-induced spin currents by a Hf spacer layer in W/Hf/CoFeB/MgO layer structures, Applied Physics Letters 104, 082407, Feb. 26, 2014, 6 pages (Year: 2014).*
(Continued)

*Primary Examiner* — Craig A. Renner
(74) *Attorney, Agent, or Firm* — Adler Pollock & Sheehan P.C.

(57) ABSTRACT

Methods, devices, and compositions for use with spintronic devices such as magnetic random access memory (MRAM) and spin-logic devices are provided. Methods include manipulating magnetization states in spintronic devices and making a structure using spin transfer torque to induce magnetization reversal. A device described herein manipulates magnetization states in spintronic devices and includes a non-magnetic metal to generate spin current based on the giant spin Hall effect, a ferromagnetic thin film with perpendicular magnetic anisotropy, an oxide thin film, and an integrated magnetic sensor. The device does not require an insertion layer between a non-magnetic metal with giant spin Hall effect and a ferromagnetic thin film to achieve perpendicular magnetic anisotropy.

3 Claims, 10 Drawing Sheets

Related U.S. Application Data continuation of application No. PCT/US2015/057496, filed on Oct. 27, 2015.

(60) Provisional application No. 62/143,962, filed on Apr. 7, 2015, provisional application No. 62/143,513, filed on Apr. 6, 2015, provisional application No. 62/086,361, filed on Dec. 2, 2014, provisional application No. 62/069,210, filed on Oct. 27, 2014.

(51) Int. Cl.

| | |
|---|---|
| *H01F 10/32* | (2006.01) |
| *H01L 43/10* | (2006.01) |
| *H01L 43/12* | (2006.01) |
| *H01L 43/14* | (2006.01) |
| *H03K 19/18* | (2006.01) |

(52) U.S. Cl.
CPC .............. *H01L 43/12* (2013.01); *H01L 43/14* (2013.01); *H03K 19/18* (2013.01); *Y10T 29/49032* (2015.01)

(56) References Cited

U.S. PATENT DOCUMENTS

| | | | |
|---|---|---|---|
| 6,303,218 | B1 | 10/2001 | Kamiguchi et al. |
| 8,456,898 | B2 | 6/2013 | Chen et al. |
| 2006/0050446 | A1 | 3/2006 | Ishizone et al. |
| 2013/0099780 | A1 | 4/2013 | Ma et al. |
| 2014/0084398 | A1 | 3/2014 | Oguz et al. |
| 2014/0169088 | A1 | 6/2014 | Buhrman et al. |

OTHER PUBLICATIONS

Hao et al., Beta (β) tungsten thin films: Structure, electron transport, and giant spin Hall effect, Applied Physics Letters 106, 182403, May 4, 2015, 5 pages (Year: 2015).*
Azevedo, et al., "Spin Pumping and Anisotropic Magnetoresistance Voltages in Magnetic Bilayers: Theory and Experiment", Physical Review B, Condensed Matter, vol. 83, Issue 144402, 2011.
Bastl, "The Hall Effect in Tungsten Films Influenced by Hydrogen Chemisorption", Thin Solid Films, vol. 10, Issue 2, May 1972, pp. 311-313.
Choi, et al., "Phase, Grain Structure, Stress, and Resistivity of Sputter-Deposited Tungsten Films", Journal of Vacuum Science & Technology, American Vacuum Society, vol. A 29, Issue 5, Sep./Oct. 2011, 8 pages.
Cubukcu, et al., "Spin-Orbit Torque Magnetization Switching of A Three-Terminal Perpendicular Magnetic Tunnel Junction", Applied Physics Letters , vol. 104, Issue 042406, 2014, 5 pages.
Datta, et al., "Non-Volatile Spin Switch for Boolean And Non-Boolean Logic", Applied Physics Letter, vol. 101, Issue 252411, 2012, 5 pages.
Dyakonov, et al., "Current-Induced Spin Orientation of Electrons in Semiconductors", Physics Letters, vol. 35 A, No. 6, Jul. 12, 1971, pp. 459-460.
Fan, et al., "Magnetization Switching Through Giant Spin-Orbit Torque in a Magnetically Doped Topological Insulator Heterostructure", Nature Materials, vol. 13, 2014, 6 pages.
Ganguly, et al., "Thickness Dependence of Spin Torque Ferromagnetic Resonance in Co75Fe25/Pt Bilayer Films", Applied Physics Letters, vol. 104, Issue 072405, 2014, 5 pages.
Hao, et al., "Beta (β) Tungsten Thin Films: Structure, Electron Transport, and Giant Spin Hall Effect", Applied Physics Letters, vol. 106, Issue 182403, May 2015, 4 pages.
Hao, et al., "Giant Spin Hall Effect and Switching Induced by Spin-Transfer Torque in a W/Co4oFe4oB20/MgO Structure with Perpendicular Magnetic Anisotropy", Physical Review Applied, vol. 3, Issue 034009, 2015, 6 pages.
Hirsch, "Spin Hall Effect", Physical Review Letters,vol. 83, No. 9, Aug. 30, 1999, pp. 1834-1837.
Katine, et al., "Current-Induced Realignment of Magnetic Domains in Nanostructured Cu/Co Multilayer Pillars", Applied Physics Letters,vol. 76, Isuue 3, Jan. 2000, 3 pages.
Lee, et al., "Central Role of Domain Wall Depinning for Perpendicular Magnetization Switching Driven by Spin Torque from the Spin Hall Effect", Physical Review B, vol. 89, Issue 024418, Jan. 2014, 25 pages.
Liu, et al. "Current-Induced Switching of Perpendicularly Magnetized Magnetic Layers Using Spin Torque from the Spin Hall Effect", Physical Review Letters, vol. 109, Issue 096602, Aug. 31, 2012, 5 pages.
Liu, "Spin Transfer Driven Magnetization Dynamics in Spin Valves and Magnetic Tunnel Junctions", Department of Physics, New York University, Jan. 2013, 250 pages.
Liu, et al., "Spin-Torque Ferromagnetic Resonance Induced by the Spin Hall Effect", Physical Review Letter, vol. 106, Issue 036601, Mar. 2011, 15 pages.
Liu, et al., "Spin-Torque Switching with the Giant Spin Hall Effect of Tantalum", Science, vol. 336, Issue 6081, 2012, pp. 555-558.
Mellnik, et al., "Spin-Transfer Torque Generated by a Topological Insulator", Nature, vol. 511, Issue 7510, Jul. 24, 2014, 11 pages.
Narasimham, et al., "Fabrication of 5-20 nm thick B—W Films", AIP Advances, vol. 4, Issue 117139, 2014, 7 pages.
Pai, et al., "Enhancement Of Perpendicular Magnetic Anisotropy and Transmission of Spin-Hall-Effect-Induced Spin Currents by a Hf Spacer Layer in W/Hf/CoFeB/Mgo Layer Structures", Applied Physics Letters, vol. 104,Issue 082407, 2014, 19 pages.
Pai, et al., "Spin Transfer Torque Devices Utilizing The Giant Spin Hall Effect of Tungsten", Applied Physics Letters, vol. 101, Issue 122404, Aug. 2012, 18 pages.
International Search Report and Written Opinion received in International Application No. PCT/US2015/057496, dated Feb. 23, 2016, 16 pages.
Perez, et al., "Chiral Magnetization Textures Stabilized by the Dzyaloshinskii-Moriya Interaction During Spin-Orbit Torque Switching", Applied Physical Letters, vol. 104, Issue 092403, 2014, 5 pages.
Petroff, et al., "Microstructure, Growth, Resistivity, And Stresses In Thin Tungsten Films Deposited By rf Sputtering", Journal of Applied Physics, vol. 44, Issue 2545, 1973, 6 pages.
Qiu, et al., "Angular and Temperature Dependence of Current Induced Spin-Orbit Effective Fields in Ta/CoFeB/Mgo Nanowires", Scientific Reports, vol. 4, No. 4491, 2014, 6 pages.
Rojas-Sánchez, et al., "Spin Pumping and Inverse Spin Hall Effect in Platinum: The Essential Role of Spin-Memory Loss at Metallic Interfaces", Physical Review Letters, vol. 112, Issue 10, Mar. 2014, 14 pages.
Samsonov, et al., "Handbook of Physicochemical Properties of the Elements", 1968, 5 pages.
Slonczewski, et al., "Current-Driven Excitation of Magnetic Multilayers", Journal of Magnetism and Magnetic Materials, vol. 159, 1996, pp. L1-L7.
Vlietstra, et al., "Exchange Magnetic Field Torques in YIG/Pt Bilayers Observed by the Spin-Hall Magnetoresistance", Applied Physics Letters, vol. 103, Issue 032401, 2013, 4 pages.
Zhang, et al., "Magnetization Reversal Induced by In-Plane Current in Ta/CoFeB/MgO Structures With Perpendicular Magnetic Easy Axis", Journal of Applied Physics, vol. 115, Issue 17C714, 2014, 3 pages.
Zhang, "Spin Hall Effect in the Presence of Spin Diffusion", Physical Review Letter, vol. 85, No. 2, Jul. 10, 2000, pp. 393-396.
Grey, "American Institute of Physics Handbook", 3rd Edition,1972, 2200 pages.
Albert, "Spin-Polarized Current Switching of a Co Thin Film Nanomagnet", vol. 77, No. 23, Dec. 4, 2000, pp. 3809-3811.

* cited by examiner

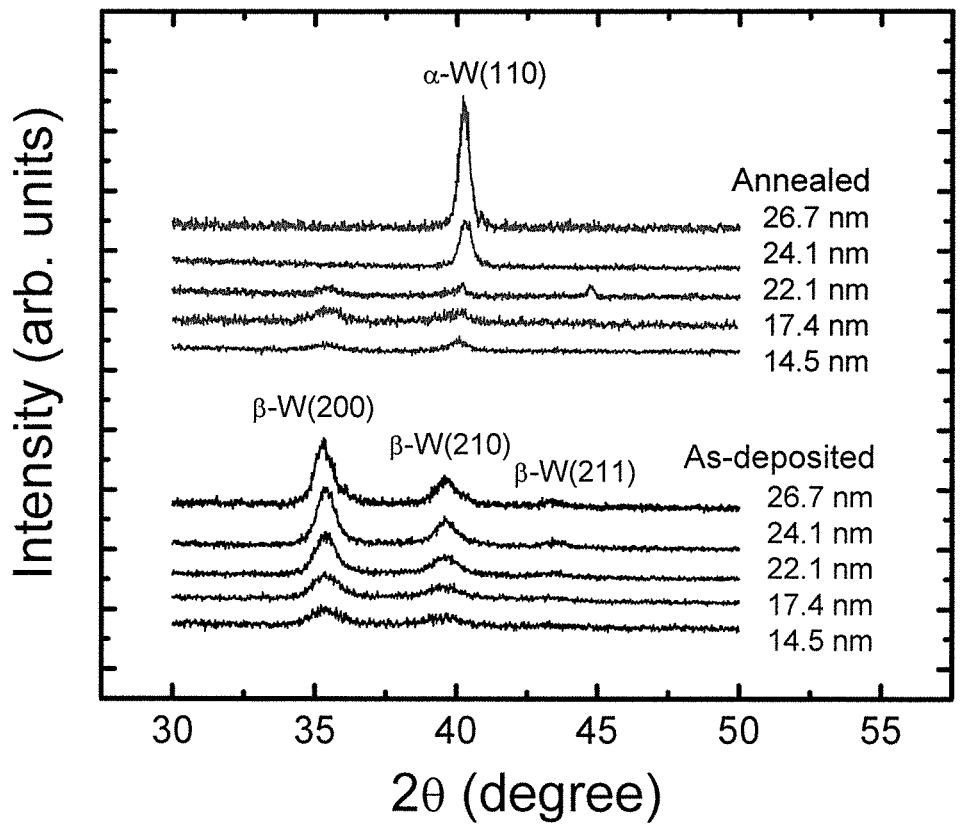
Figure 6
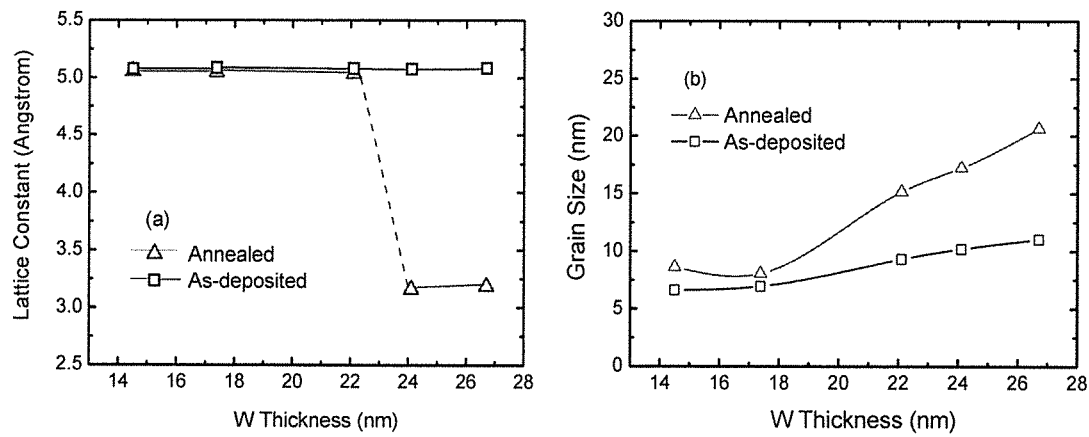
Figure 7A
Figure 7B

BETA TUNGSTEN THIN FILMS WITH GIANT SPIN HALL EFFECT FOR USE IN COMPOSITIONS AND STRUCTURES WITH PERPENDICULAR MAGNETIC ANISOTROPY

RELATED APPLICATIONS

This application is a continuation of U.S. utility application Ser. No. 15/498,685 filed Apr. 27, 2017, which claims the benefit of international application serial number PCT/US2015/057496 filed Oct. 27, 2015, which claims the benefit of U.S. provisional applications 62/069,210 filed Oct. 27, 2014; 62/086,361 filed Dec. 2, 2014; 62/143,513 filed Apr. 6, 2015; and 62/143,962 filed Apr. 7, 2015 in the U.S. Patent and Trademark Office, each of which is hereby incorporated herein by reference in its entirety.

GOVERNMENT SUPPORT

This invention was made with government support under grants DMR1307056 and DMR1229195 awarded by the National Science Foundation. The government has certain rights in the invention.

TECHNICAL FIELD

Methods, devices, and compositions are provided for use with spintronic devices including magnetic random access memory (MRAM) and spin-logic devices (SLD).

BACKGROUND

Spin Hall effect (SHE), particularly giant spin Hall effect (GSHE), in non-magnetic metals with strong spin-orbit coupling (SOC), has received much attention in development and improvement of MRAM and SLD. See, Dyakonovet et al., *Phys. Lett. A* 35, 459 (1971); Hirsch, *Phys. Rev. Lett.* 83, 1834 (1999); Azevedo et al., *Phys. Rev. B* 83, 144402 (2011); Vlietstra et al., *Appl. Phys. Lett.* 103, 032401 (2013); Liu et al., *Phys. Rev. Lett.* 106, 036601 (2011); Lee et al., *Phys. Rev. B* 89, 024418 (2014); Ganguly et al., *Appl. Phys. Lett.* 104, 072405 (2014); Liu et al., *Science* 336, 555 (2012); Pai et al., *Appl. Phys. Lett.* 104, 082407 (2014); Pai et al., *Appl. Phys. Lett.* 101, 122404 (2012); Mellnik et al., *Nature* 511, 449 (2014); Fan et al., *Nature Materials* 13, 699 (2014); Zhang, *Phys. Rev. Lett.* 85, 393 (2000). Large spin Hall angles (θ) have been discovered in solids ranging from the simple SOC solids: platinum (θ=0.08), tantalum (θ=0.15), and tungsten (θ=0.30) to topological insulators: $Bi_2Se_3$ (θ=2.0-3.5) and $BiSbTe_3$. See, Azevedo et al., *Phys. Rev. B* 83, 144402 (2011); Vlietstra et al., *Appl. Phys. Lett.* 103, 032401 (2013); Liu et al., *Phys. Rev. Lett.* 106, 036601 (2011); Lee et al., *Phys. Rev. B* 89, 024418 (2014); Ganguly et al., *Appl. Phys. Lett.* 104, 072405 (2014); Pai et al., *Appl. Phys. Lett.* 104, 082407 (2014); Pai et al., *Appl. Phys. Lett.* 101, 122404 (2012); Mellnik et al., *Nature* 511, 449 (2014); Fan et al., *Nature Materials* 13, 699 (2014); Liu et al., *Science* 336, 555 (2012). The spin Hall angle is used to manipulate magnetization states in spintronic devices. See, Liu et al., *Phys. Rev. Lett.* 106, 036601 (2011); Liu et al., *Science* 336, 555 (2012); Fan et al., *Nature Materials* 13, 699 (2014). A material with a larger spin Hall angle is more efficient at converting longitudinal electrical charge current ($J_c$) to a transverse spin current ($J_s$) than a material with a smaller spin Hall angle.

Tungsten (W) has the largest spin Hall angle (0.3) among transition metals. The preparation of W has been developed to be compatible with modern semiconductor fabrication processes. W metallization processing is widely used for very-large-scale-integration (VLSI) circuits, and the stable and conductive α-W is more commonly used in semiconductor processing than β-W. See, Petroff et al., *Appl. Phys. Lett.* 44, 2545 (1973). Structures of β-W/ferromagnetic thin film (FM) resulting in perpendicular magnetic anisotropy (PMA) have not previously been obtained. For MRAM and SLD applications, PMA is required for high performance. The common practice of inserting a hafnium layer (e.g. β-W/Hf/FM) to encourage PMA has the deleterious effects of lowering the effective spin Hall angle and increasing fabrication complexity. See, Pai et al., *Appl. Phys. Lett.* 104, 082407 (2014).

β-W has not been well studied in the context of GSHE, for example, the intrinsic spin Hall angle and spin diffusion length in bulk β-W previously remained undefined. The spin Hall angle dependency on β-W thin film thickness has not previously been measured and studied. Further, much effort has previously been spent to stabilize β-W. There is a need to develop methods of fabrication of stable β-W thin films that have a broad range of thicknesses and which simultaneously exhibit GSHE.

SUMMARY

A non-limiting exemplary embodiment herein provides a device for manipulating magnetization states in spintronic devices which includes a non-magnetic metal having a spin Hall angle of sufficient size to convert a longitudinal electrical charge current to a traverse spin current; a ferromagnetic thin film with perpendicular magnetic anisotropy having an interface with the non-magnetic metal, such that the non-magnetic metal yields a spin-transfer torque (STT) within the thin film that causes magnetization switching; and an integrated magnetic sensor that senses magnetic states representing digital bits.

In various embodiments, the spin Hall angle is at least about 0.08. In an embodiment, the spin Hall angle is about 0.49. In an embodiment, the ferromagnetic thin film is $(Co_xFe_{100-x})_{100-y}B_y$, which is also expressed as CoFeB, in which x and y are each an atomic percent. Each of x and y are greater than 0 and less than 100.

In certain embodiments, the magnetic sensor is a ferromagnetic thin film such as CoFeB which exhibits anomalous Hall effect (AHE). In certain embodiments, the magnetic sensor is a magnetic tunneling junction or a giant magnetoresistive (GMR) element. In certain embodiments, the non-magnetic metal is β-form tungsten. In certain embodiments, the tungsten has a thickness within the range of about 3.0 nm to about 30 nm, for example, about 1.0 nm to about 7.0 nm, about 1.0 nm to about 10 nm, or about 10 nm to about 30 nm. In an embodiment, the non-magnetic metal has a resistivity of at least about 40 μΩ-cm.

A non-limiting exemplary embodiment herein provides a method of making a structure for spin-transfer torque (STT)-induced magnetization reversal including depositing sequentially layers of W, CoFeB, and MgO on a thermally oxidized Si wafer using a high vacuum magnetron sputtering system to form a stack, such that the CoFeB layer of the stack has a thickness in a range of from about 1.0 nm to about 30.0 nm; depositing a capping layer or overlayer that prevents oxidation of the stack; and patterning the stack into standard Hall bars or alternative device forms. In various embodiments, the capping layer or overlayer includes tantalum. In certain embodiments, a capping layer is an outermost layer of the multilayer composition provided herein. In certain embodiments, an overlayer is a layer between the multilayer composition provided herein and additional layers of the device incorporating the multilayer composition.

In various embodiments, the CoFeB layer of the stack has a thickness in a range of about 1.0 nm to about 10 nm, about 2.0 nm to about 15 nm, about 5.0 nm to about 20 nm, or about 10 nm to about 30 nm.

A non-limiting exemplary embodiment herein provides a method for manipulating magnetization states in spintronic devices including coupling a non-magnetic metal having a spin Hall angle of size sufficient to convert a longitudinal electrical charge current to a traverse spin current, to a ferromagnetic thin film with perpendicular magnetic anisotropy, such that the non-magnetic metal yields a spin-transfer torque (STT) within the thin film resulting in magnetization switching; and sensing, by an integrated magnetic sensor, magnetic states that represent digital bits. In certain embodiments, the method further including, prior to depositing, the step of measuring the resistivity of the non-magnetic metal to identify the phase.

A non-limiting exemplary embodiment herein provides a multilayer composition for manipulating magnetization states in spintronic devices, which includes a non-magnetic metal layer having a spin Hall angle that converts an electrical charge to a traverse spin current, in which the non-magnetic metal layer has a thickness selected from the group consisting of: less than about 8 nm, less than about 6 nm, less than about 4 nm, less than about 2 nm, or in a range of about 0.25 nm to about 30 nm; a free layer having perpendicular magnetic anisotropy and an interface with the non-magnetic metal layer, in which the free layer is configured to accept the traverse spin current from the non-magnetic metal layer producing spin-transfer torque (STT) in the free layer and magnetization switching; and an oxide barrier layer with a crystalline structure having an interface with the ferromagnetic layer.

In various embodiments, the non-magnetic metal layer has a thickness selected from the range of about 0.1 nm to about 5.0 nm, about 0.5 nm to about 10 nm, about 5 nm to about 20 nm, or about 10 nm to about 30 nm. In certain embodiments, the composition is arranged in a stacked structure, for example, a Hall bar. In certain embodiments, the composition does not have an insertion layer, for example, does not have an insertion layer with hafnium. In certain embodiments, the switching current in the non-magnetic metal that induces magnetization reversal is about $10^6$ A/cm$^2$ in the free layer. In various embodiments, the free layer has a coercivity of at least about 0.1 Oe, at least about 0.5 Oe, at least about 1 Oe, at least about 5 Oe, at least about 10 Oe, at least about 15 Oe, at least about 20 Oe, or at least about 100 Oe. In an embodiment, the free layer is a ferromagnetic thin film.

In certain embodiments, the composition further includes a capping layer or overlayer having an interface with the oxide barrier layer. In various embodiments, the spin Hall angle of the non-magnetic metal layer is at least about 0.05, at least about 0.1, at least about 0.5, at least about 1, and at least about 2. In various embodiments, the non-magnetic metal has a resistivity selected from the group consisting of: at least about 100 μΩ-cm, at least about 150 μΩ-cm, at least about 200 μΩ-cm, and at least about 250 μΩ-cm, at least about 300 μΩ-cm, at least about 350 μΩ-cm, at least about 400 μΩ-cm, and at least about 450 μΩ-cm. In various embodiments, the non-magnetic metal layer has a spin diffusion length of at least about 0.1 nm, at least about 0.5 nm, at least about 1 nm, at least about 2 nm, at least about 4 nm, at least about 5 nm, at least about 6 nm, or at least about 7 nm. In various embodiments, the tungsten has a thickness of about 1 nm, about 3 nm, about 5 nm, or about 7 nm. In various embodiments, tungsten has a thickness within the range of about 5 nm to about 30 nm, for example, about 5 nm to about 15 nm, about 10 nm to about 25 nm, or about 15 nm to about 30 nm.

A non-limiting exemplary embodiment herein provides a method of manipulating magnetization states in a spintronic device, the method including applying an electric charge to a multilayer composition having: a non-magnetic metal layer with a spin Hall angle of size sufficient to convert an electrical charge to a traverse spin current; a free layer with perpendicular magnetic anisotropy having an interface with the non-magnetic metal layer; and an oxide barrier layer with a crystalline structure having an interface with the ferromagnetic layer; and creating spin-transfer torque (STT) in the free layer by the traverse spin current from the non-magnetic metal layer yielding magnetization switching.

In certain embodiments, the method further includes the step of measuring the resistivity of the non-magnetic metal to identify the phase. In certain embodiments, the method further includes detecting with a magnetic sensor, magnetic states representing digital bits. In an embodiment, the free layer is a ferromagnetic thin film. In certain embodiments, the STT current for magnetization reversal is selected from a range of from about $10^4$ A/cm$^2$ to about $10^7$ A/cm$^2$. For example, the STT current for magnetization reversal is about $10^6$ A/cm$^2$. For example, the STT current is in a range of from about $10^4$ A/cm$^2$ to about $10^5$ A/cm$^2$, about $10^5$ A/cm$^2$ to about $10^6$ A/cm$^2$, or about $10^6$ A/cm$^2$ to about $10^7$ A/cm$^2$. In an embodiment, the STT current for magnetization reversal is about $10^6$ A/cm$^2$.

A non-limiting exemplary embodiment herein provides a method of making a structure for manipulating magnetization states in a spintronic device, the method including depositing sequentially each of layers of tungsten, CoFeB, and MgO on a thermally oxidized Si wafer using a high vacuum magnetron sputtering system, such that the tungsten layer of the stack has a thickness of about 1 nm, about 2 nm, about 3 nm, about 4 nm, about 5 nm, about 6 nm, about 7 nm, or within a range of about 7 nm to about 30 nm; and depositing a capping layer or overlayer that prevents oxidation of the stack.

In various embodiments, the tungsten layer of the stack has a thickness in a range of about 1.0 nm to about 10 nm, about 2.0 nm to about 15 nm, about 5.0 nm to about 20 nm, or about 10 nm to about 30 nm.

In various embodiments, the sputtering system has a base pressure of less than about $0.5\times10^{-8}$ Torr, less than about $1\times10^{-8}$ Torr, less than about $2\times10^{-8}$ Torr, less than about $3\times10^{-8}$ Torr, less than about $1\times10^{-7}$ Torr, less than about $3\times10^{-7}$ Torr, $1\times10^{-6}$, or $3\times10^{-6}$ Torr. In various embodiments, the sputtering system has a sputtering pressure of at least about 0.5 mTorr, at least about 1 mTorr, at least about 2 mTorr, at least about 3 mTorr, or at least about 4 mTorr, at least about 5 mTorr, at least about 10 mTorr, or at least about 15 mTorr.

In certain embodiments, the method further includes the step of depositing the CoFeB layer of the stack to a thickness of about 0.25 nm, about 0.5 nm, about 1 nm, about 1.5 nm, about 2 nm, about 2.5 nm, about 3 nm, or in the range of about 3 nm to about 20 nm. In certain embodiments, depositing is performed at an intermittent DC sputtering power selected from the group consisting of: at least about 1 W, at least about 3 W, at least about 5 W, at least about 7

W, or within a range of about 5 W to about 200 W. In certain embodiments, the sputtering power is within a range of about 5 W to about 25 W, about 10 W to about 50 W, about 25 W to about 75 W, about 50 W to about 100 W, 75 W to about 125 W, about 100 W to about 150 W, about 125 W to about 175 W, or about 150 W to about 200 W. In certain embodiments, the DC sputtering power is applied intermittently. In certain embodiments, the DC sputtering power is applied continuously. In certain embodiments, the step of depositing is performed at a rate of less than about 0.005 nm/s, less than about 0.01 nm/s, less than about 0.05 nm/s, less than about 0.1 nm/s, less than about 0.5 nm/s, less than about 1 nm/s, and less than about 5 nm/s, or less than about 10 nm/s. In an embodiment, the capping layer or overlayer includes tantalum. In another embodiment, the free layer is CoFeB.

A non-limiting exemplary embodiment herein provides a multilayer composition for manipulating magnetization states in spintronic devices, the composition includes a non-magnetic metal layer having a spin Hall angle that converts an electrical current to a traverse spin current, the non-magnetic metal layer having a thickness that is less than the critical thickness ($t_c$) of the non-magnetic layer for the formation of the highly resistive phase, and the thickness is greater than the spin diffusion length ($\lambda_{sf}$) of the non-magnetic layer having a resistivity at a temperature range of from about 5 K to about 600 K; a free layer having perpendicular magnetic anisotropy and an interface with the non-magnetic metal layer, the free layer being configured to accept the traverse spin current from the non-magnetic metal layer producing spin-transfer torque (STT) in the free layer and magnetization switching; and an oxide barrier layer with a crystalline structure having an interface with the free layer. In non-limiting exemplary embodiments, the temperature range is about 5 K to about 550 K. For example, the temperature range is between 5-10 K, 5-25 K, 10-50 K, 25-100 K, 75-150 K, 200-300 K, 250-350 K, 300-400 K, 350-450 K, 400-500 K, and 450-550 K.

In certain embodiments of the composition, the resistivity is constant to within about 15% throughout a temperature range. For example, the resistivity varies +/−15%. Alternatively, the resistivity is not constant at different temperatures. In certain embodiments, the free layer is a ferromagnetic thin film. In certain embodiments, the composition further includes a capping layer or overlayer having an interface with the oxide barrier layer. In various embodiments, the spin Hall angle is selected from the group consisting of at least about 0.01, at least about 0.1, at least about 1, and at least about 10. For example, the spin Hall angle is selected from a range of from about 0.05 to about 0.25, about 0.2 to about 1.0, about 1.0 to about 5.0, or about 5.0 to about 10. In certain embodiments, the spin Hall angle is selected from a range of from about 0.05 to about 0.5.

In certain embodiments, the composition is arranged in a stacked structure. In various embodiments, the non-magnetic metal is a 3d, 4d, or 5d transition metal, or their alloys. For example, the metal or the component of an alloy is selected from the group of metals consisting of: scandium, yttrium, titanium, zirconium, vanadium, niobium, tungsten, platinum, hafnium, molybdenum, ruthenium, rhodium, palladium, osmium, iridium, platinum, gold, and tantalum. In various embodiments, the non-magnetic metal is one of the metalloids or their alloys. For examples, the metal or the component of the alloy is selected from the group of metals including: gallium, germanium, arsenic, selenium, indium, tin, antimony, tellurium, thallium, lead, and bismuth. Spin-orbit coupling (SOC) among these metals is not negligible.

In certain embodiments, the composition does not have an insertion layer, for example, the composition lacks an insertion layer comprising hafnium.

Non-limiting exemplary embodiments of the non-magnetic metal include or contain β-form tungsten. In certain embodiments, the tungsten has a thickness within a range of from about 0.5 nm to about 100 nm. In non-limiting exemplary embodiments, the thickness is selected from a range of from about 3 nm to about 22 nm. In certain embodiments, the non-magnetic metal has a resistivity at room temperature of at least about 75 μΩ-cm, at least about 150 μΩ-cm, at least about 225 μΩ-cm, at least about 300 μΩ-cm, at least about 375 μΩ-cm, at least about 450 μΩ-cm, or at least about 525 μΩ-cm. In certain non-limiting exemplary embodiments, the non-magnetic metal has a resistivity in a range from about 75 μΩ-cm to about 450 μΩ-cm.

In certain embodiments of the composition, the ferromagnetic thin film has the composition of $Co_{40}Fe_{40}B_{20}$ (in units of atomic percent). In various non-limiting embodiments, the ferromagnetic thin film has the general composition of $(Co_xFe_{100-x})_{100-y}B_y$, where $0<x<100$ and $0<y<100$. This general composition is to be referred to as CoFeB, which includes $Co_{40}Fe_{40}B_{20}$.

In certain embodiments, the non-magnetic metal layer has a spin diffusion length of at least about 0.1 nm, at least about 1 nm, at least about 5 nm, at least about 10 nm, or at least about 20 nm. In non-limiting exemplary embodiments, the spin diffusion length is within a range of from about 0.1 nm to about 20 nm. For example, the spin diffusion length is about 10 nm.

In certain embodiments, the stacked structure is annealed in a vacuum environment and subjected to an applied magnetic field whose direction is perpendicular to the plane of the stacked structure to obtain the perpendicular magnetic anisotropy. For example, the stacked structure is annealed at a temperature of at least about 50° C., at least about 100° C., at least about 200° C., at least about 300° C., at least about 400° C., or at least about 500° C. The duration of the annealing process is within the range of about 1 second and about 24 hours. In non-limiting exemplary embodiments, the temperature is in a range of from about 50° C. to about 400° C. In various embodiments, the vacuum environment is within the range of about $1\times10^{-12}$ Torr and 100 Torr. In certain embodiments, the applied magnetic field is within the range of about $1\times10^{-3}$ T and 20 T. In certain embodiments, the β-form tungsten prior to being annealed is single phase having an $A_3B$ solid with A15 crystal structure.

A non-limiting exemplary embodiment herein provides a method of manipulating magnetization states in a spintronic device, the method including applying an electric current to a multilayer composition having: a non-magnetic metal layer with a spin Hall angle of size sufficient to convert an electrical current to a traverse spin current; a free layer with perpendicular magnetic anisotropy having an interface with the non-magnetic metal layer; and an oxide barrier layer with a crystalline structure having an interface with the ferromagnetic layer; and creating spin-transfer torque (STT) in the free layer by the traverse spin current from the non-magnetic metal layer yielding magnetization switching.

In certain embodiments, the method further includes the step of measuring the resistivity of the non-magnetic metal to identify the phase. In certain embodiments, the free layer is a ferromagnetic thin film. In certain embodiments, the method further includes after creating STT, detecting with a magnetic sensor, magnetic states representing digital bits.

In certain embodiments, the tungsten has a thickness selected from a range of from about 1 nm to about 100 nm.

In non-limiting exemplary embodiments, the thickness is selected from a range of from about 3 nm to about 30 nm. For example, the thickness is in a range of from 1 nm-10 nm, 5 nm-25 nm, 20 nm-50 nm, 30 nm-75 nm, or 50 nm-100 nm.

In certain embodiments, the method further includes, prior to applying the electric current, annealing the multilayer composition. In certain embodiments, the annealing step is performed at a temperature of at least about 50° C., at least about 100° C., at least about 200° C., at least about 300° C., at least about 400° C., or at least about 500° C. In an embodiment, the temperature is in a range of from about 50° C. to about 300° C.

A non-limiting exemplary embodiment herein provides a method of making a structure for manipulating magnetization states in a spintronic device including the steps of: depositing sequentially layers of W, CoFeB, and MgO on a thermally oxidized Si wafer to form a stacked structure using a high vacuum magnetron sputtering system, in which the W layer of the stacked structure has a thickness in a range of from about 1 nm to about 100 nm. For example, the thickness is in a range of from about 1 nm-10 nm, 5 nm-25 nm, 20 nm-50 nm, 30 nm-75 nm, or 50-100 nm.

In certain embodiments, the method further includes, after depositing tungsten, CoFeB, and MgO, a step of depositing a capping layer or overlayer that prevents oxidation of the stacked structure. In an embodiment, the capping layer or overlayer is tantalum. In various embodiments, the sputtering system has a base pressure of less than about $1\times10^{-11}$ Torr, less than about $1\times10^{-10}$ Torr, less than about $1\times10^{-9}$ Torr, less than about $1\times10^{-8}$ Torr, less than about $1\times10^{-7}$ Torr, or less than about $1\times10^{-6}$ Torr. In various embodiments, the sputtering system has a base pressure in a range of from about $0.5\times10^{-8}$ Torr to about $3\times10^{-8}$ Torr. In certain embodiments, the sputtering system has a sputtering pressure of at least about 0.1 mTorr, at least about 1 mTorr, at least about 10 mTorr, at least about 20 mTorr, or at least about 30 mTorr. In certain non-limiting exemplary embodiments, the sputtering system has a sputtering pressure in a range of from about 0.5 mTorr to about 10 mTorr. In certain embodiments, the method further includes depositing the CoFeB layer of the stack at a thickness of about 0.1 nm, about 0.5 nm, about 1 nm, about 5 nm, about 10 nm, about 50 nm, or about 100 nm. In an embodiment, the CoFeB layer has a thickness in a range of from about 0.25 nm to about 3 nm.

In certain embodiments, the depositing step is performed at an intermittent or continuous DC and RF sputtering power of at least about 1 W, at least about 10 W, at least about 100 W, or at least about 1000 W. In certain non-limiting exemplary embodiments, the depositing step is performed at an intermittent DC and RF sputtering power in a range of from about 1 W to about 7 W. In certain embodiments, depositing is performed at a rate of less than about 0.005 nm/s, less than about 0.01 nm/s, less than about 0.05 nm/s, less than about 0.5 nm/s, or within the range of about 0.1 nm/s to about 5 nm/s. In certain non-limiting exemplary embodiments, depositing is performed at a rate in a range of from about 0.005 nm/s to about 0.1 nm/s.

In certain embodiments, the non-magnetic metal layer is annealed prior to inclusion in the multilayer composition. In certain embodiments, the non-magnetic metal layer is annealed as a component of the multilayer composition. In certain embodiments, the stacked structure is deposited at a higher temperature than ambient temperature and/or under an applied magnetic field whose direction is perpendicular to the plane of the stacked structure.

A non-limiting exemplary embodiment herein provides a method for fabricating a metastable thin film including cooling a substrate to a temperature of liquid nitrogen or to a temperature between 77 K and ambient temperature, for example, room temperature; combining argon and oxygen to form a sputtering gas; and depositing onto the substrate the metastable thin film using the sputtering gas at a sputtering power in the range of about 1 W to about 1000 W, and depositing at a rate in a range of from about 0.02 nm/s to about 10 nm/s. In various embodiments of the method, β-W thin films are deposited at a rate greater than about 0.02 nm/s. For example, the β-W thin films are deposited at a rate of greater than about 0.05 nm/s, greater than about 0.1 nm/s, greater than about 0.5 nm/s, greater than about 1 nm/s, greater than about 5 nm/s, or greater than about 10 nm/s. In non-limiting embodiments, the rate of deposition is in a range of from about 0.01 nm/s to about 0.1 nm/s, about 0.1 nm/s to about 1 nm/s, or about 1 nm/s to about 10 nm/s. In certain embodiments, a β-W thin film is deposited onto a substrate that is cooled to liquid nitrogen temperature or to a temperature between 77 K and ambient temperature, for example, room temperature. In an embodiment of the method, the substrate is cooled prior to deposition. In an embodiment, cooling the substrate assists in formation of thin films. For example, β-W thin films are formed.

In certain embodiments, depositing of the β-W thin films is performed by sputtering. In certain embodiments, the sputtering occurs at a power of less than about 1000 W. For example, the sputtering power is at least about 1 W, at least about 5 W, at least about 10 W, at least about 50 W, at least about 100 W, at least about 500 W, or at least about 1000 W. In various embodiments, the sputtering power is in a range of from about 1 W to about 5 W, about 5 W to about 10 W, about 10 W to about 50 W, about 50 W to about 100 W, about 100 W to about 500, or about 500 W to about 1000 W. In certain embodiments, the sputtering is performed using pure argon (Ar) gas, for example, pure sputtering argon. In certain embodiments, the sputtering is performed using a combination of argon and oxygen including but not limited to 80% of Ar and 20% $O_2$. In an embodiment, incorporation of oxygen into the sputtering gas stabilizes the metastable thin films. For example, β-W thin films are stabilized by the presence of the 02 during depositing.

BRIEF DESCRIPTION OF THE DRAWINGS

FIG. 6 contains plots of θ-2θ x-ray diffraction patterns for as-deposited and annealed W thin films having various thicknesses.

FIG. 7A is a line graph of lattice constant determined from x-ray diffraction as a function of W film thickness for as-deposited and annealed samples.

FIG. 7B is a line graph of grain size determined by using the Scherrer equation as a function of W film thickness.

DETAILED DESCRIPTION

A magnetoresistive stack which includes a pinned layer, a non-magnetic spacer layer, and a magnetic free layer contacting a non-magnetic base layer with GSHE was developed by Buhrman et al., U.S. patent application publication 2014/0169088. The pinned layer and the free layer of the stack of Buhrman are ferromagnetic. Ibid. The base layer of the stack of Buhrman has a thickness no greater than about five times the spin diffusion length of the base layer, and more preferably has a thickness of about 1.5 times to 3 times the spin diffusion length. Ibid.

Figure 1:
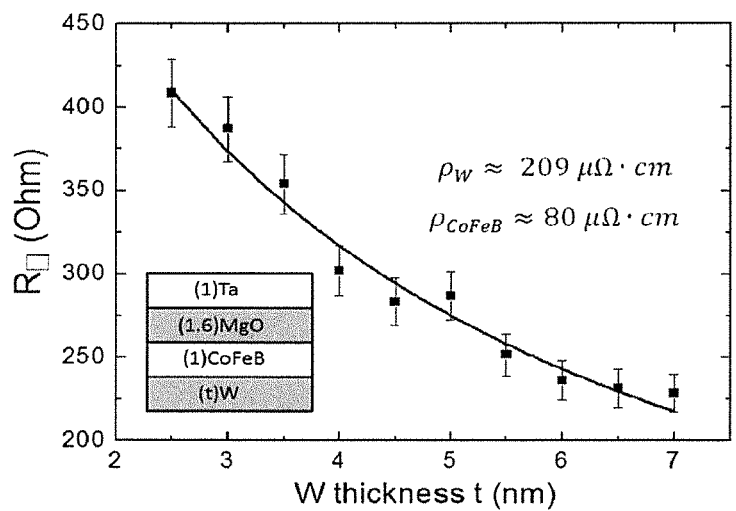
FIG. 1 is a line graph of the sheet resistance (Re) of W(thickness)/CoFeB(1.0 nm)/MgO(1.6 nm)/Ta(1.0 nm) multilayer stacks as a function of W thickness (t) in the range of 2.5 nm-7.0 nm. The solid line is the best fit to the data based on extracted resistivities of $\rho_W$ of about 209 μΩ-cm and $\beta_{FeCoB}$ of about 80 μΩ-cm.

Certain embodiments herein provide a stacked structure containing a non-magnetic layer, a free layer which is ferromagnetic, and an oxide barrier layer. The non-magnetic layer of the structures herein was a metastable β-W thin film. The stacked structure is illustrated in FIG. 1. The as-deposited W thin films were in the β-W phase for thicknesses from 3.0 to 26.7 nm. The β-W remains intact below a critical thickness ($t_c$) of 22.1 nm, even after magnetic thermal annealing at 280° C., which induces PMA in the stacked structure. Results of x-ray diffraction data herein are evidence of β-W structure after magnetic thermal annealing for the range of thicknesses from about 3.0 nm to about 22.1 nm. See, FIG. 6 and FIG. 7A. β-W with a thickness greater than the spin diffusion length (3.5 nm to 4.3 nm) and less than 22.1 nm was observed to remain in n-form after annealing. The crystalline grain size of the annealed 13-W thin films is larger than the spin diffusion length (3.5 nm to 4.3 nm). See, FIG. 7B. The resistivity of annealed β-W was observed to be nearly constant at a range of thicknesses and at temperatures in a range of 10 K and 300 K. See, FIG. 8A. The relatively constant resistivity over such a wide temperature range and thickness range is desirable for spintronics application, since the magnetic switching power from the GSHE would be less sensitive to temperature.

Methods and data herein provide strategies to obtain giant spin Hall effect and STT induced switching in a layered stack of W/CoFeB/MgO with perpendicular magnetic anisotropy. Further, the data from examples herein show that giant spin Hall effect in β-W resulted in reduced the critical current density for STT induced magnetic switching in the free layer, CoFeB. An MRAM or SLD with PMA results in lower power consumption, higher reliability, higher durability, and reduced or eliminated volatility compared to the characteristics of earlier generations of MRAM.

Robust PMA was observed in the Examples herein using a structure obtained by a simple fabrication technique, a β-W/CoFeB/MgO layered structure with W having a thickness in a range of 3.0 nm-22.1 nm without an insertion layer between W and CoFeB. As a result of GSHE in β-W, the critical current density for the STT induced magnetic switching in CoFeB was observed to have been reduced in the Examples herein. Therefore, the elemental β-W is a strong candidate for magnetic memory and spin-logic applications.

Example 1—Analysis of the Interface Between a GSHE Solid and a Ferromagnetic (FM) Thin Film The layered structures herein contain an interface between a GSHE solid and a FM thin film with PMA, commonly referred to as a free layer. The injected spin current from the GSHE solid yielded STT inside the free layer to effect a magnetization switching. See, Slonczewski et al., *Magn. Mater.* 159, L1 (1996); Katine et al., *Appl. Phys. Lett.* 76, 354 (2000). The magnetic states representing the digital bits are sensed by an integrated magnetic sensor, such as an anomalous Hall effect sensor, a magnetic tunneling junction (MTJ), or a giant magnetoresistive (GMR) element. See, Liu et al., *Science* 336, 555 (2012); Cubukcu et al, *Appl. Phys. Lett.*, 104, 042406 (2014). STT-MRAM with PMA has a number of advantages, including low power consumption, high reliability, durability, and data non-volatility compared to earlier generations of MRAM.

Among the limited number of GSHE solids previously discovered, metastable β-W was observed to have high resistivity. The large SOC of β-W was observed to be useful in various applications. The spin Hall angle of β-W was observed to be 0.3, which is considered large among transition metals. See, Pai et al., *Appl. Phys. Lett.*, 104, 082407 (2014). The preparation of β-W thin films is compatible with modern semiconductor fabrication processes.

Figure 4A:
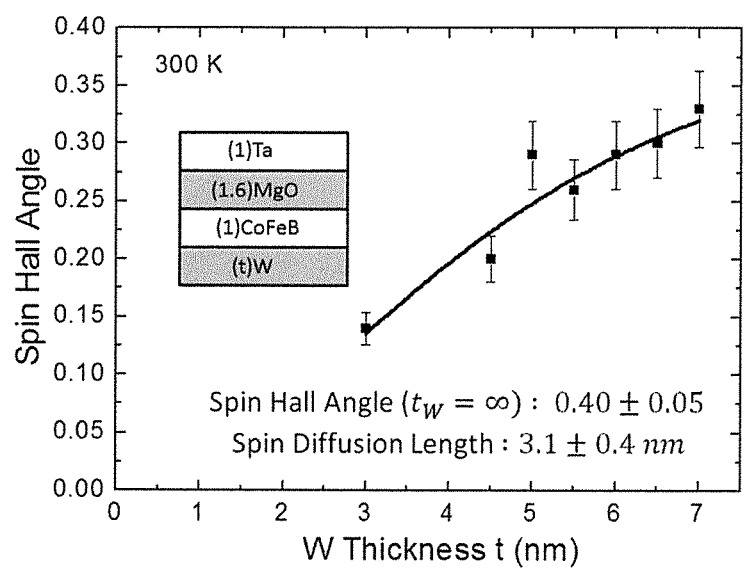
FIG. 4A is a line graph of spin Hall angles versus W thickness for W(t)/CoFeB(1.0 nm)/MgO(1.6 nm)/Ta(1.0), with t in the range of 3.0 nm to 7.0 nm. The line represents theoretical fitting to the data assuming a finite spin diffusion length in the β-W film. For the bulk β-W film, spin Hall angle was observed to be 0.40±0.05 and spin diffusion length was observed to be 3.1±0.4 nm at room temperature.
Figure 4B:
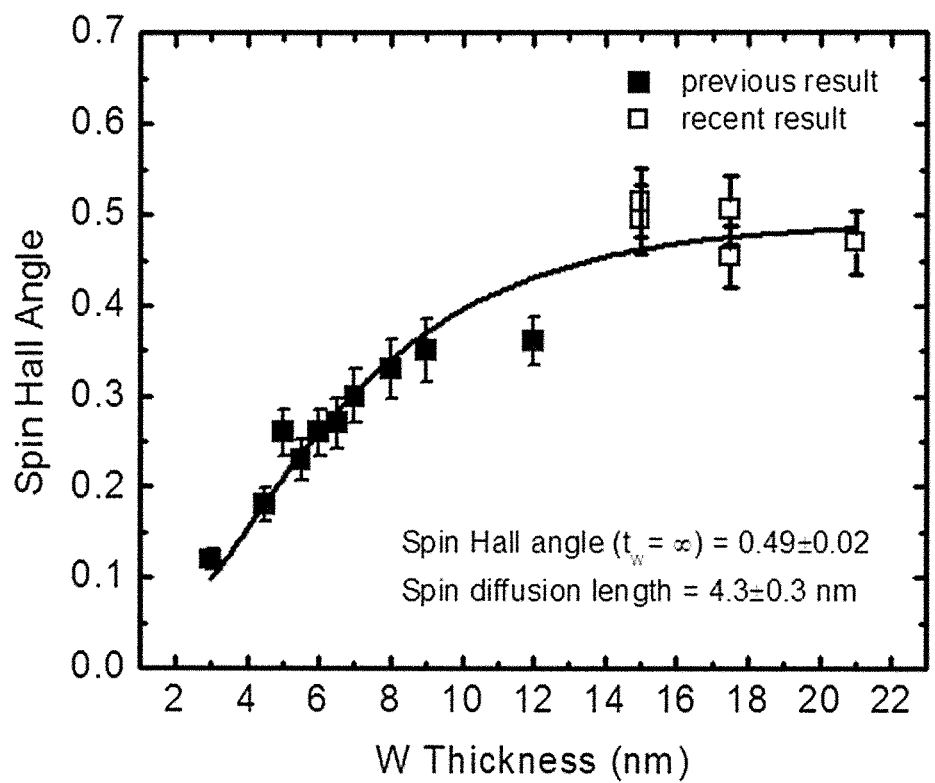
FIG. 4B is a line graph of spin Hall angles versus W thickness for W(t)/CoFeB(1.0 nm)/MgO(1.6 nm)/Ta(1.0 nm), with t in the range of 3.0 nm to 22.1 nm. The lines represents theoretical fitting of the data assuming a finite spin diffusion length in the β-W film. For the bulk β-W film, spin Hall angle was observed to be 0.49±0.02 and spin diffusion length was observed to be 4.3±0.3 nm at room temperature.

The range of thicknesses of β-W was extended to 26.7 nm for preparation of the structure herein to observe variation of spin Hall angle over a broad range of β-W thickness. FIG. 4A shows that spin Hall angle as a function of thickness between 3.0 nm and 7.0 nm. FIG. 4B shows the spin Hall angle as a function of thickness between 3 nm and 22.1 nm. From this analysis, the bulk-limit spin Hall angle was observed to be at least 0.49, which is the largest among transition metals, and the spin diffusion length was observed to be in the range of 3.1 nm to 4.3 nm for β-W. Both parameters are important for understanding the advantages of β-W in the context of GSHE, and for development of STT-MRAM and spin-logic devices incorporating β-W and FM thin films with PMA. Results herein show that the amount of STT-induced switching current for magnetization reversal was about $10^6$ A/cm$^2$, one order of magnitude smaller than what was previously observed with similar structures. See, Liu, *Science* 336, 555 (2012); Pai et al., *Appl. Phys. Let.* 104, 082407 (2014).

GSHE was observed in the β-W/CoFeB/MgO system herein with PMA. The spin Hall angle was observed to be 0.49±0.02 and spin diffusion length was observed to be 4.3±0.4 nm in bulk β-W film at room temperature. This was the largest spin Hall angle that had been observed among elemental solids with a large spin-orbit coupling. See, Azevedo et al., *Phys. Rev.* B 83, 144402 (2011); Vlietstra et al., *Appl. Phys. Lett.* 103, 032401 (2013); Liu et al., *Phys. Rev. Lett.* 106, 036601 (2011); Lee et a., *Phys. Rev. B* 89, 024418 (2014); Ganguly et al., *Appl. Phys. Lett.* 104, 072405 (2014); Liu et al., *Science* 336, 555 (2012); Pai et al., *Appl. Phys. Lett.* 104, 082407 (2014); Pai et al., *Appl. Phys. Lett.* 101, 122404 (2012). Furthermore, PMA, which is critical for spintronics applications has not previously been obtained in 3-W/CoFeB/MgO.

Example 2—Preparation of Layered Structures

The multilayered structures or compositions (stacks) herein were prepared on thermally oxidized Si wafers using a high vacuum magnetron sputtering system. During preparation, the base pressure was set at less than $2 \times 10^{-8}$ Torr and the Ar sputtering pressure was set at about 2.2 mTorr. For each sample, the stack was sequentially deposited in the order of W/CoFeB/MgO/Ta. The Ta layer which had a thickness of 1 nm was a capping layer or overlayer to prevent oxidation of the active layers by the atmosphere.

The DC sputtering power for the CoFeB layer was 10 W. The thickness of the $Co_{40}Fe_{40}B_{20}$ layer was fixed at 1 nm to allow CoFeB to develop PMA. For formation of β-W, a low DC sputtering power of 3 W was applied intermittently to keep the deposition rate less than 0.02 nm/s. Multiple stacks were prepared, each with W at a thickness in the range of the 2.5 to 26.7 nm. These stacks were patterned using photolithography into standard Hall bars with areas of 20×55 μm$^2$ for measurements of Hall Effect and resistivity. The stacks were annealed at 280° C. for one minute with two hours of ramping up and six hours of natural cooling in a vacuum at $1 \times 10^{-6}$ Torr, and a magnetic field of 0.45 Tesla was applied perpendicular to the plane of the stacks. Magnetotransport measurements were performed on these stacks using an electromagnet at room temperature. The preparation parameters above can be further optimized. For example, the sputtering power is increased to reduce thin film deposition time. The annealing time including ramping up/down and duration at the fixed temperature can be reduced to increase the throughput of the annealing process. The magnetic field can be selected in a range including 0.45 Tesla, and the annealing temperature can be selected from a range including about 280° C.

The Quantum Design® Physical Property Measurement System (PPMS) was used to measure the saturated magnetization (Ms) of the stacks at room temperature. M, for CoFeB at a thickness of 1 nm in the stacks was observed to be about 1100 emu/cm$^3$.

To identify the phase of the W layer, sheet resistance ($R_\square$) of the stacks W(thickness, t)/CoFeB(1.0)/MgO(1.6)/Ta(1.0) was measured. FIG. 1 is a graph of the value of $R_k$ as a function of W thickness in the range of 2.5 nm to 7.0 nm. The solid line is the best fit to the data based on resistivities of $\rho_W$ which was observed to be about 209 μΩ-cm and $\beta_{FeCoB}$ which was observed to be about 80 μΩ-cm. Typical resistivities for the stable α-W phase and the metastable β-W phase are less than 40 μΩ-cm and greater than 150 μΩ-cm, respectively. These high resistivity values indicate that β-W was present in the samples herein.

Figure 2A:
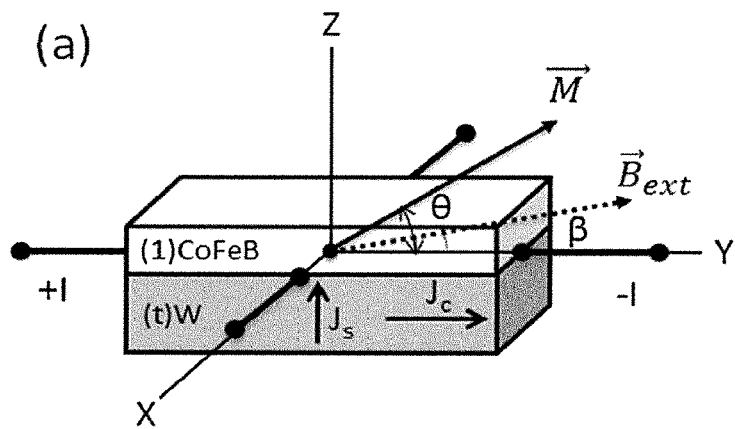
FIG. 2A is a schematic of the W/CoFeB bilayer in the Hall bar configuration for magnetotransport measurement under an external magnetic field ($B_{ext}$) and an excitation DC current (I). β is the angle between the vector of $B_{ext}$ and y-axis. $J_c$ is the charge current density in the W layer, and $J_s$ is the SHE converted spin current density into the CoFeB layer. M is the magnetization vector of the CoFeB FM layer. θ is the angle between the vector M and the y-axis.

Conditions for the magnetotransport measurement are illustrated in the schematic of FIG. 2A. A DC current was sent along the Y-axis of a Hall-bar sample, and the Hall voltage along the X-axis was measured. An external magnetic field ($B_{ext}$) was applied in the YZ plane with an angle β between the field and Y-axis. The resulting magnetization vector (M) was observed in the YZ plane at an angle θ from the Y-axis.

Figure 2B:
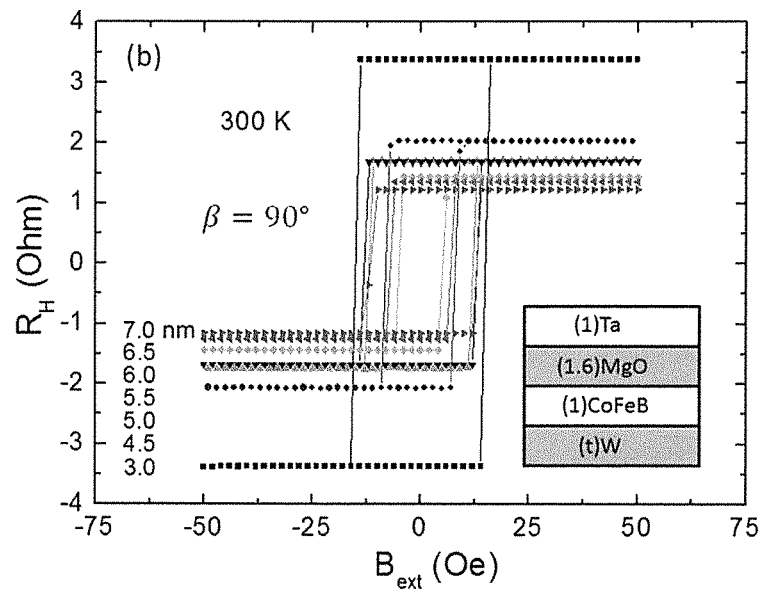
FIG. 2B is a graph of anomalous Hall resistance ($R_H$) as a function of cycling external magnetic field, $B_{ext}$ (Oe), applied perpendicular (β=90°) to the stacks of W(t)/CoFeB (1.0 nm)/MgO(1.6 nm)/Ta(1.0 nm), in which t is in the range of 3 nm-7 nm. The square-shaped loops for every W thickness indicate that CoFeB exhibits PMA for each sample with a different W thickness. PMA in this structure has not previously been observed.

FIG. 2B is a graph of the anomalous Hall resistance ($R_H$) as a function of magnetic field applied perpendicularly to the sample plane (β=90°), W(t)/CoFeB(1.0)/MgO(1.6)/Ta(1.0), for a series of samples with W thicknesses in the range of 3 nm to 7 nm. The square hysteresis loops for each sample in FIG. 2B revealed PMA in the W/CoFeB without an insertion layer between W and CoFeB. The switching field, or coercivity $H_c$, was varied from 5 Oe to 22 Oe. The square-shaped loops for each W thickness indicate that CoFeB exhibited PMA for each sample at each W thickness. PMA in this structure has not previously been observed in the stacked structure.

Example 3—Analysis of Magnetization Switching

Figure 2C:
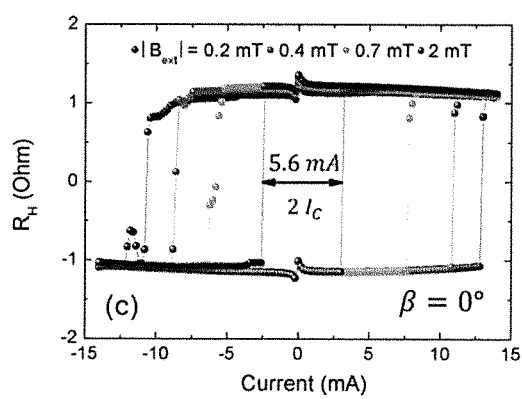
FIG. 2C is a graph of current-induced magnetic switching curves in the W(7.0 nm)/CoFeB(1.0 nm)/MgO(1.6 nm)/Ta (1.0 nm) multilayer stack sample, under a negative (β=0°) external field $B_{ext}$ at each of 0.2 mT, 0.4 mT, 0.7 mT, and 2 mT. From each switching curve, critical current ($I_C$) was obtained.
Figure 2D:
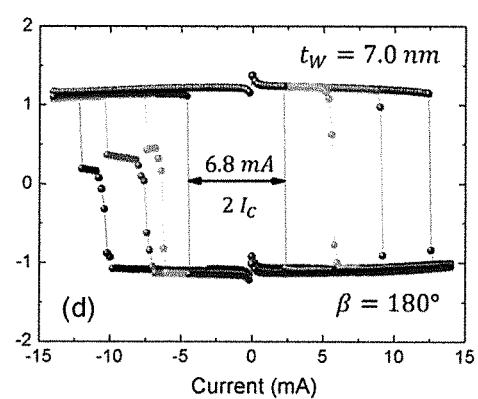
FIG. 2D is a graph of current-induced magnetic switching curves in the W(7.0 nm)/CoFeB(1 nm)/MgO(1.6 nm)/Ta(1 nm) sample, under a positive (1=1800) external field $B_{ext}$ at each of 0.2 mT, 0.4 mT, 0.7 mT, and 2 mT. From each switching curve, critical current ($I_C$) was obtained.

The anomalous Hall Effect (AHE) provides a sensing mechanism to measure the magnetization state of the CoFeB layer. This example illustrates the response of the magnetization state of the CoFeB layer to excitation current (I) in the W layer and $B_{ext}$. FIG. 2C and FIG. 2D are graphs of current-induced magnetic switching behavior of a representative sample, W(7.0)/CoFeB(1.0), under a series of positive ($\beta=0°$) or negative ($\beta=180°$) in-plane fields at values of $B_{ext}$ equal to 0.2 mT, 0.4 mT, 0.7 mT, and 2 mT. The bi-stable states of M (up and down) are accessible by cycling current in both directions through a critical value ($I_c$), under either a positive or negative $B_{ext}$. See, FIG. 2C and FIG. 2D. Critical current ($I_c$) was defined as the average of the positive and negative switching current. For W(7.0 nm)/CoFeB(1.0 nm), $I_c$ was observed to be about 3.1 mA, corresponding to a critical current density ($J_c$) of about $1.5 \times 10^6$ A/cm$^2$ in the W layer under an in-plane field of 2 mT. See, FIG. 2C. This value is about one order of magnitude smaller than those obtained in other PMA structures: Ta/CoFeB, Pt/Co, and W/Hf/CoFeB. See, Liu et al., *Science* 336, 555 (2012); Pai et al., *Appl. Phys. Lett.* 104, 082407 (2014); Zhang et al., *J. Appl. Phys.* 115, 17C714 (2014); Qiu et al., *Scientific Reports* 4, 4491 (2014); Liu et al., *Phys. Rev. Lett.* 109, 096602 (2012).

The current-induced magnetic switching in PMA structures results from the STT mechanism due to the injected spin current density ($J_S$) from the SOC solid with GSHE. See, Liu et al., *Phys. Rev. Lett.* 109, 096602 (2012). Under the measurement conditions of FIG. 2A, the equilibrium orientation (0) of M in the PMA CoFeB layer was calculated from the condition that the net torque on M is zero, using the following equation:

$$\tau_{int} \equiv \hat{x} \cdot (\vec{\tau}_{ST} + \vec{\tau}_{ext} + \vec{\tau}_{an}) = \tau_{ST}^0 + B_{ext}\sin(\theta-\beta) - B_{an}^0 \sin\theta\cos\theta = 0, \quad (1)$$

$$\text{where } \tau_{ST}^0 = \frac{h}{2eM_x t} J_S$$

is the torque per unit moment, and $B_{an}^0$ is the perpendicular anisotropy field. See, Liu et al., *Phys. Rev. Lett.* 109, 096602 (2012). This macrospin model was used to predict the current-induced magnetic switching in FIG. 2C, at sufficient current density greater than $J_c$, or corresponding ST, $\tau_{ST}^0$ per unit moment. In FIG. 2C, the lowest $J_C$ of about $1.5 \times 10^6$ A/cm$^2$ was observed at 2 mT, an amount which was about 5 to 10 times less than that reported for other PMA systems. See, Liu et al., *Science* 336, 555 (2012); Pai et al., *Appl. Phys. Lett.* 104, 082407 (2014); Zhang, *J. Appl. Phys.* 115, 17C714 (2014); Qiu et al., *Scientific Reports* 4, 4491 (2014); Liu et al., *Phys. Rev. Lett.* 109, 096602 (2012).

In the coherent spin rotation regime, Eq. (1) was also used as a method to measure r, hence, the converted spin current density $J_S$ from which the spin Hall angle can be derived using $\theta=J_S/J_c$. See, Liu et al., *Phys. Rev. Lett.* 109, 096602 (2012). In Eq. (1), the spin Hall angle ($\theta$) was obtained from the anomalous Hall resistance, $R_H/R_0=\sin\theta$, where $R_0$ is the maximum Hall resistance when M is perpendicular to the sample plane.

According to Eq. (1), as $B_{ext}$ approaches zero or infinity, $\theta$ reaches 0 or 90°, respectively. Under an intermediate $B_{ext}$, and a positive or a negative current of 1 mA, $\theta$ was observed to be dependent on $\tau_{ST}^0$, $B_{ext}$, and $B_{an}^0$, which illustrates how the relationship between the $R_H$ and $\sin\theta$ varies as a function of Be. See, FIG. 3A. At an arbitrary $\sin\theta$, two $B_{ext}$ values exist, $B_+(\theta)$ and $B_-(\theta)$, corresponding to the positive and negative current, respectively. See, FIG. 3A. From Eq. (1), $$\tau_{ST}^0(+J_S) + B_+(\theta)\sin(\theta-\beta) - B_{an}^0 \sin\theta\cos\theta = 0 \quad (2)$$

$$\tau_{ST}^0(-J_S) + B_-(\theta)\sin(\theta-\beta) - B_{an}^0 \sin\theta\cos\theta = 0 \quad (3)$$

Figure 3A:
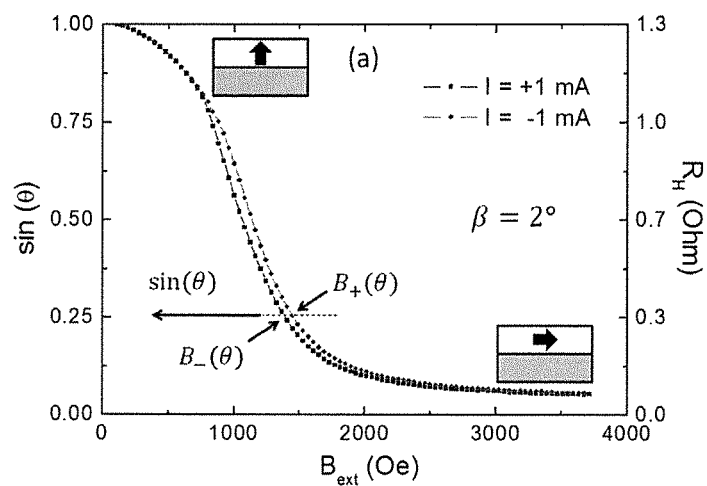
FIG. 3A is a line graph of normalized Hall resistance (i.e., sin θ) as a function of nearly in-plane magnetic field $B_{ext}$ (1=20) under a positive or negative current (+/−1 mA) for β-W in W(6.5 nm)/CoFeB(1.0 nm)/MgO(1.6 nm)/Ta(1.0 nm). θ is the angle between the magnetization vector M and the Y-axis. $B_+(θ)$ and $B_-(θ)$ are the magnetic fields required to rotate the M to θ corresponding to the positive and the negative current.

By solving the simultaneous equations using combination of Eqs. (2)±(3), the following are obtained:

$$[B_+(\theta) - B_-(\theta)] = \Delta\tau_{ST}^0/\sin(\theta-\beta) \quad (4)$$

$$[B_+(\theta) + B_-(\theta)] = 2B_{an}^0 \sin\theta\cos\theta/\sin(\theta-\beta) \quad (5),$$

where $\Delta\tau_{ST}^0 = \tau_{ST}^0(+J_S) - \tau_{ST}^0(-J_S) = 2\tau_{ST}^0(|J_S|)$. FIG. 3A is a graph of the quantities of B+($\theta$), B.($\theta$), and $\theta$ for W(6.5 nm)/CoFe(1.0 nm)/MgO(1.6 nm). Using Eq. (4) and (5), $\tau_{ST}^0(|J_S|)$ and $B_{an}^0$ were calculated.

Figure 3B:
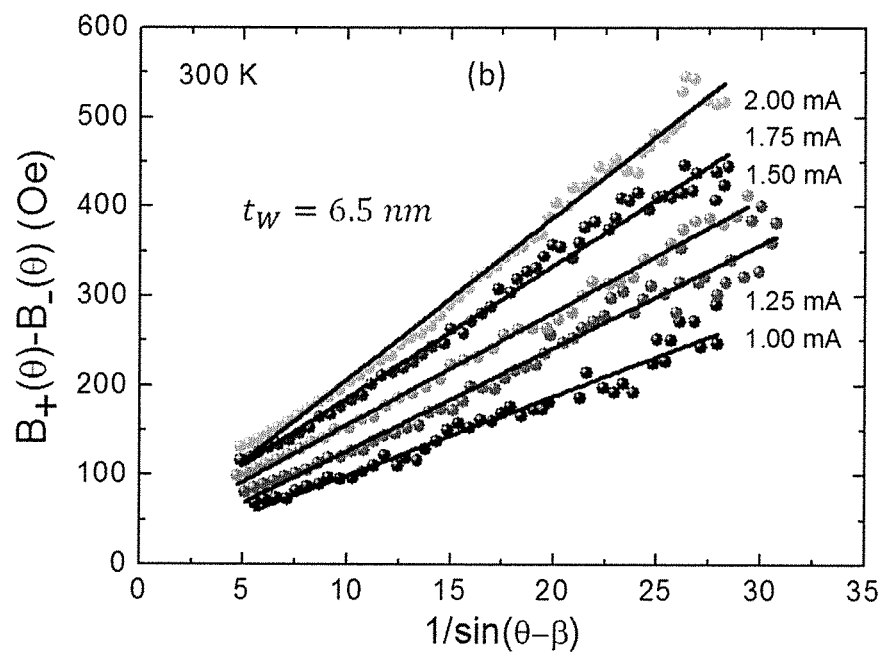
FIG. 3B is a line graph of linear relationships between $B_+(θ)-B_-(θ)$ and $1/\sin(θ−β)$ under different excitation currents in the range of 1 mA-2 mA for W at a thickness of 6.5 nm in W(6.5 nm)/CoFeB(1.0 nm)/MgO(1.6 nm)/Ta(1.0 nm). The slope for each fitted straight line is the net STT, $\Delta\tau_{ST}^0$, between the positive and negative excitation current.
Figure 3C:
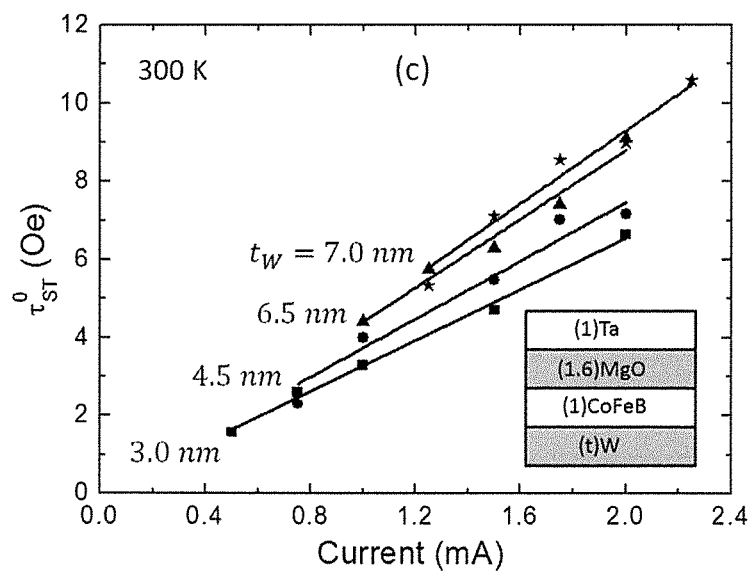
FIG. 3C is a graph of spin-transfer torques ($\tau_{ST}^0$) as a function of excitation current for W(t)/CoFeB(1.0 nm)/MgO (1.6 nm)/Ta(1.0), with t in the range of 3.0 nm to 7.0 nm. Torque values are linear in current and vanish as current approaches zero. Thicker layers of W generate more torque per unit of current.

FIG. 3B, a graph of $[B_+(\theta)-B_-(\theta)]$ as a function of $1/\sin(\theta-\beta)$, uses the data obtained in FIG. 3A. As predicted by Eq. (4), linear relations were observed at various currents, and the slope was $\Delta\tau_{ST}^0$ for each current. See, FIG. 3B. Using this method, the STT, $\tau_{ST}^0(|J_S|)$ as a function of current was determined for samples with variable W thicknesses. See, FIG. 3C. Using the data in FIG. 3C, the spin Hall angle was calculated according to $$\theta = J_s/J_c = \left(\frac{2eM_s t}{h}\right)(\tau_{ST}^0/J_c).$$

FIG. 4A shows the relationship of the spin Hall angle as a function of W thickness (t) in the range of 3 nm to 7 nm for W(t)/CoFeB(1.0)/MgO(1.6)/Ta(1.0) stacked structure with PMA. At 7.0 nm, the spin Hall angle was observed to be $\theta(7\text{ nm})=0.33\pm0.03$. At the thinner limit, spin Hall angle was observed to decrease, as the W thickness approached the spin diffusion length ($\lambda_{sf}$). See, FIG. 4A and FIG. 4B. Variation of the Hall angle versus W thickness was evidence that $\theta(\infty)=0.49\pm0.02$ and $\lambda_{sf}=4.3\pm0.3$ nm in the bulk $\beta$-W film, according to $$\frac{J_s(t)}{J_s(\infty)} = \frac{\Theta(t)}{\Theta(\infty)} = 1 - \text{sech}\left(\frac{t}{\lambda_{sf}}\right)$$

which was used to fit the data in FIG. 4A and FIG. 4B. See also, Liu et al., *Phys. Rev. Lett.* 106, 036601 (2011). *In comparison*, $\theta(5.2\text{ nm})=0.33\pm0.06$ was observed for W/CoFeB/MgO with in-plane magnetic anisotropy, and effective $\theta(4\text{ nm})=0.34\pm0.05$ was observed in W/Hf/CoFeB/MgO with Hf-induced PMA. In certain embodiments, an insertion layer, Hf, is not needed between W and CoFeB to obtain PMA. See, FIG. 2A.

Determination of the bulk $\theta(\infty)$ and $\lambda_{sf}$ for $\beta$-W is beneficial to further theoretical understanding of this SOC solid and to designing spintronic devices by selecting appropriate $\beta$-W thickness. Moreover, PMA was achieved in W/CoFeB/

MgO without an insertion layer which is known to reduce spin Hall angle. See, Pai et al., *Appl. Phys. Lett.* 104, 082407 (2014).

Figure 5:
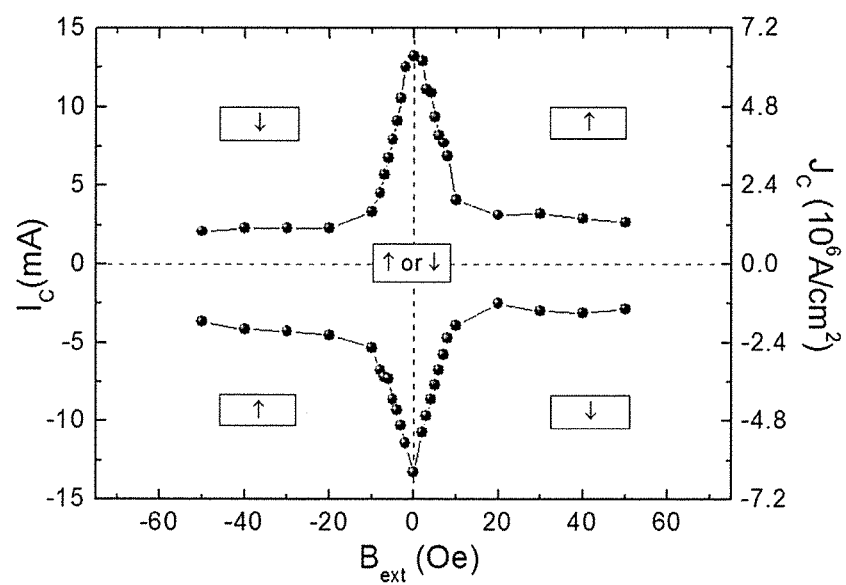
FIG. 5 is a magnetic switching phase diagram of W(7.0 nm)/CoFeB(1.0 nm)/MgO(1.6 nm)/Ta(1.0), in the parameter space of $B_{ext}$ and critical current ($I_c$) or $J_c$. The arrows (↑ or ↓) denote the directions of the M vector in various regions. $I_c$ is the net current into the Hall bar, and $J_c$ is the corresponding current density only in the W layer.

As shown in FIG. 2C, with sufficient current, for example STT, M of the CoFeB layer undergoes the switching as described by Eq. (1). The largest Hall angle in the sample series herein was observed in the magnetic switching phase diagram for a representative sample W(7.0)/CoFeB(1.0)/MgO(1.6), each sample having an area of 20×55 µm². See, FIG. 5. The critical switching current density ($J_C$) in the W layer was observed to decrease rapidly and linearly with increasing field ($B_{ext}$) up to a characteristic field $B_0$ of about 10 Oe, and at a slower rate when $B_{ext}$ was greater than $B_0$. See, FIG. 5. As a comparison, $B_0$ of about 150 Oe and 3000 Oe were observed for two other PMA systems: Ta(5 nm)/CoFe(0.6 nm)/MgO(1.8 nm) having an area of 1.2×15 µm² and Pt(2 nm)/Co(0.6 nm)/AlO$_x$ having an area of 20×200 µm², respectively. See, Liu et al., *Phys. Rev. Lett.* 109, 096602 (2012); Perez et al., *Appl. Phys. Lett.* 104, 092403 (2014).

The lower $B_0$ observed in this PMA system led to reliable switching under a small external field. In STT-MRAM or spin-logic applications, a low biasing field is more easily implemented than a ten-time larger field. $B_0$ was observed to have the magnitude of the nucleation field in the stacks herein (see coercivity values in FIG. 2B).

The magnetic switching phase diagram of the PMA CoFeB driven by STT from the β-W was analyzed. Under an in-plane biasing field of only 20 Oe, the switching current density was observed to be about $1.6 \times 10^6$ A/cm² which is the lowest among other PMA systems with GSHE. Thick β-W films integrated with CoFeB ferromagnetic film without an insertion layer were observed to achieve robust PMA. The large Hall angle and acquired PMA makes β-W a candidate for STT-MRAM and spin-logic applications, with the added advantage of its compatibility with modern semiconductor fabrication.

Example 4—Fabrication of Metastable Thin Films Using Sputtering

Examples herein provide data which are evidence of structure, electron transport, and GSHE of β-W thin films. Thermal annealing of the β-W films resulted in a lower switch current density compared to the β-W films prior to annealing indicating thermal annealing is useful for materials used in spintronic MRAM and SLD. See, Hao et al., *Applied Physics Letters* 106, 182403 (2015), which is hereby incorporated by reference in its entirety. Results herein show that films having a thickness up to 22.1 nm remained in the β phase through the annealing process, and films with a thickness greater than 22.1 nm were transformed into a phase by the annealing process. Therefore, the thickness of β-W films that were magnetic thermal annealed for use in spintronic devices was observed to have been greater than the spin diffusion length ($\lambda_{sf}$) of 3.5 nm to 4.3 nm and less than 22.1 nm to have maximized GSHE in β-W films.

Spintronic MRAM and logic processors have exploited the physics of the spin Hall effect for switching bits, and the materials engineering for prior structures remains challenging. The large spin-orbit coupling in β-W yielded a very low critical current density for magnetization switching after annealing. Methods of fabrication of the technologically promising structures of the various embodiments of the invention herein are provided.

The W films herein were prepared on thermally oxidized Si wafers under ambient conditions using a high vacuum magnetron sputtering system equipped with a cryopump. The fabrication conditions included a base pressure that was less than $2 \times 10^{-8}$ Torr and the Ar sputtering pressure that was about 2.2 mTorr. For the formation of β-W, a low DC sputtering power of 3 W was applied intermittently to keep the deposition rate constant at 0.02 nm/s. The films were patterned into standard Hall bars using photolithography for spin Hall effect and resistivity measurements, with the longitudinal dimensions of 20×55 µm² in area. In addition to these as-deposited samples, a corresponding set of samples was prepared that were annealed at 280° C. for 1 minute with 2 hours of ramping up and 6 hours of natural cooling in vacuum ($1 \times 10^{-6}$ Torr) and under a magnetic field (0.45 T) perpendicular to the films.

In certain embodiments, the metastable thin films were fabricated by a method including depositing a metastable thin film onto a substrate using a sputtering system. For example, a β-W thin film was deposited using a sputtering power in the range of from about 3 W to about 1000 W and at a rate in the range of from about 0.02 nm/s to about 10 nm/s. Improved formation of metastable thin films is obtained by depositing the β-W thin film onto a substrate cooled to a temperature less than the ambient temperature, for example, the temperature of liquid nitrogen.

Methods are provided herein of making the metastable thin films by sputtering a material onto a substrate. In these methods, the metastable thin film was stabilized prior to inclusion in the multilayered structures. The metastable thin film used was generally β-W thin film. The fabrication process was performed using pure argon as the sputtering gas. Improved stabilization of metastable thin films is expected by using a combination of argon and oxygen as the sputtering gas. For example, oxygen content is 2% to 60% of the total sputtering gas in the sputtering process.

A magnetron sputtering process which generated giant spin Hall effect was used to fabricate β-W thin films. As-deposited thin films were observed to be in the metastable β-W phase at thicknesses from 3.0 nm to 26.7 nm. The β-W phase was observed to have remained intact below a critical thickness of 22.1 nm even after high vacuum magnetic thermal annealing at 280° C., which induces perpendicular magnetic anisotropy in the layered structures herein of β-W/Co$_{40}$Fe$_{40}$B$_{20}$/MgO. Intensive annealing was observed to have transformed the films with thicknesses greater than 22.1 nm into the stable α-W phase.

Example 5—Analysis of Structure and Grain Size of Thin Films

The structure and grain size of β-W and α-W thin films were analyzed by x-ray diffraction analysis with the Bruker D8 Discover X-Ray Diffraction (XRD) System. Electron transport in terms of resistivity and normal Hall effect was observed through a temperature range of as low as about 10 K to at least about 300 K on each sample. Low switching current density was observed in β-W/Co$_{40}$Fe$_{40}$B$_{20}$/MgO, a result that indicates that the films are technologically promising for future generations of spintronic magnetic random access memories (MRAM) and spin-logic devices.

Highly resistive β-W was observed to have strong SOC leading to GSHE in this metal. See, Pai et al., *Appl. Phys. Lett.* 101, 122404 (2012); Pai et al., *Appl. Phys. Lett.* 104, 082407 (2014); Hao et al., *Phys. Rev. Appl.* 3, 034009 (2015). The spin Hall angle of β-W was observed to approach 0.49, which is the largest among transition elements, and β-W was observed to convert charge current into spin current efficiently. See, Hao et al., *Phys. Rev. Appl.* 3, 034009 (2015), which is hereby incorporated by reference in its entirety. Robust PMA was observed in a layer structure combining metastable β-W and $Co_{40}Fe_{40}B_{20}$ thin film. Ibid. The GSHE yielded, after suitable thermal magnetic annealing, a low critical current density for magnetization switching. Ibid.

Future generations of spintronic MRAM and spin-logic devices will increasingly rely on GSHE in β-W films. See, Liu et al., *Science* 336, 555 (2012); Datta et al., *Appl. Phys. Lett.* 101, 252411 (2012).

A series of β-W thin films with a broad range of thickness (3.0-26.7 nm) were prepared using a magnetron sputtering process. Based on this process, PMA and a large spin Hall angle (0.49) in the bulk β-W in a structure of β-W/$Co_{40}Fe_{40}B_{20}$/MgO were achieved. See, Hao et al., *Phys. Rev. Appl.* 3, 034009 (2015). The effect of thermal annealing on the structure of the W films was examined. See, Hao et al., *Appl. Phys. Lett.* 106, 182403 (2015).

FIG. 6 is a recording of the XRD patterns for as-deposited and annealed W films, each with a thickness up to 26.7 nm. The as-deposited films had single phase β-W, which is an $A_3B$ solid with the A15 type crystal structure. The annealed films remained in β-W phase up to a critical thickness ($t_c$) of 22.1 nm. Above 22.1 nm, films were transformed into α-W phase, which had the bcc crystal structure.

FIG. 7A is a graph of the lattice constant as a function of W film thickness, which revealed the effect of annealing. Up to a thickness of 26.7 nm, the lattice constant of the as-deposited β-W films were observed to be unchanged. See, FIG. 7A. Post-annealing and beyond to, the lattice constant becomes that of the a structure. Ibid. Therefore, the thickness of β-W which has been magnetically thermally annealed and has GSHE intended for spintronics devices, is smaller than $t_0$. The spin diffusion length ($\lambda_{sf}$) in β-W film is in a range of 3.5 nm to 4.3 nm, which is also smaller than to. See, Hao et al., *Phys. Rev. Appl.* 3, 034009 (2015). Therefore, the full strength of the GSHE of β-W film is exploited at a thickness that is less than $t_c$, and is larger than $\lambda_{sf}$.

Based on XRD data, the grain size or size of crystallites was obtained using the Scherrer equation as a function of W film thickness for as-deposited and annealed samples. See, FIG. 7B. According to the Scherrer equation, which relates the grain size to the broadening of a diffraction peak, the average grain size was observed by Kλ/β cos θ, where K is a shape factor (typically about 0.9), λ is the x-ray wavelength, β is the width of a diffraction line at half maximum intensity, and θ is the Bragg angle. The Scherrer equation was observed to have remained valid, to the extent that the peak broadening is primarily due to grain size rather than other inhomogeneities. The grain size was observed to be smaller than, and increased with the film thickness. Annealing was observed to increase the grain size by about 50% to 70%. The grain size in all samples was larger than the $\lambda_{sf}$, which is 3.5 nm in β-W, by a factor of 2 to 4. See, Hao et al., *Phys. Rev. Appl.* 3, 034009 (2015). Therefore, $\lambda_{sf}$ was observed not to be predominantly affected by the grain size, and was more dependent on the local structures within the β-W crystallites, such as atomic and lattice disorders.

Example 6—Analyzing Electron Transport Properties of the Films

Figure 8A:
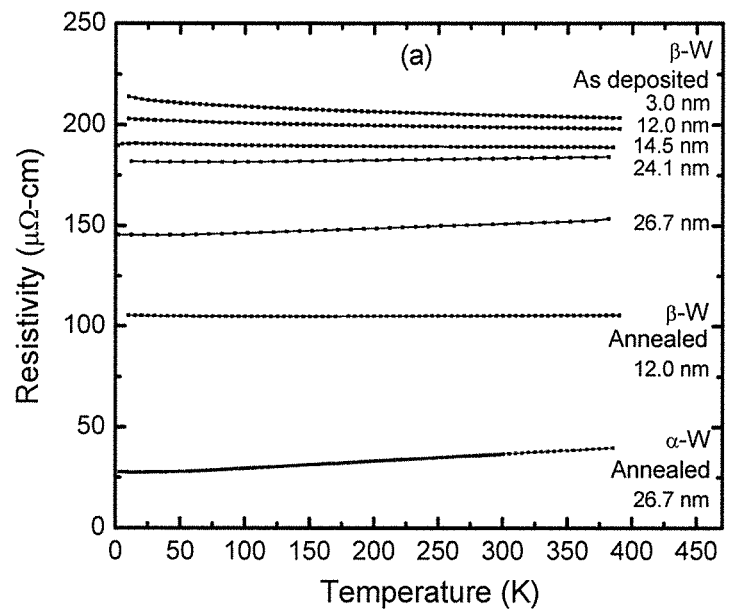
FIG. 8A is a plot of temperature dependence of resistivity for β-W and α-W thin films between 10 K and 380 K.

FIG. 8A is a graph of the resistivities of the W films as a function of temperature in the range of 5 K to 380 K. The as-deposited β-W films (3.0 to 24.1 nm) were observed to be characterized by very large resistivities of 185 to 210 μΩ-cm at 300 K. See, FIG. 8A. The temperature coefficient of resistivity, $(1/\rho)\Delta\rho/\Delta T$, was observed to be small for the β-W films through the temperature range of 5 K to 380 K. For example, for the 14.5 nm-thick β-W film, resistivity was observed to have remained nearly constant at 188 μΩ-cm from 5 K to 380 K. Ibid. This property is advantageous if β-W is used to generate spin current based on the GSHE because the magnetic switching power will not depend on temperature, facilitating a wide temperature range of operations for spintronic devices.

For a continuous thin film with a thickness (t) larger than the effective electron mean free path ($\lambda_{eff}$), the thin film resistivity is expressed as:

$$\rho(t) = \rho_B + \frac{3}{8}\rho_B\lambda_{eff}/t, \quad (6)$$

where $\rho_B$ is the bulk resistivity.

Figure 8B:
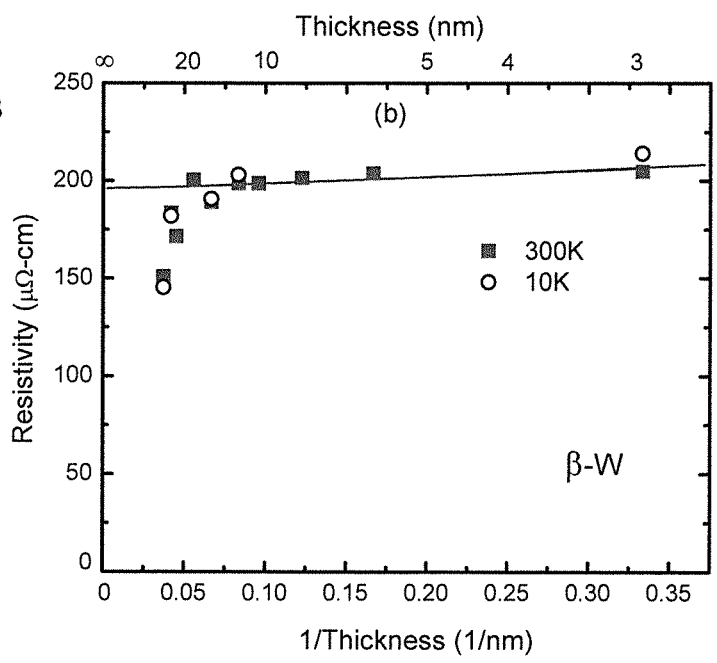
FIG. 8B is a line graph of resistivities at 300 K and 10 K as a function of an inverse of film thickness (1/t) for β-W films in the range of 3.0 nm to 26.7 nm. The solid straight line is the theoretical fit using Eq. (6), in the range of 3.0 nm and 22.1 nm based on the finite-size effect of thin film resistivity.

FIG. 8B is a graph of the resistivities of the β-W thin films as a function of the inverse thickness (1/t). In the range of 3.0 to 22.1 nm, Eq. (1) fits the observed resistivity data. From the fit, $\rho_B$ (300 K) was observed to be about 195 μΩ-cm, $\lambda_{eff}$(300 K) was observed to be about 0.45 nm, $\rho_B$(10 K) was observed to be about 192 μΩ-cm, and $\lambda_{eff}$(10 K) was observed to be about 0.95 nm for the bulk β-W film. The thermally induced resistivity, $\Delta\rho=\rho_B(300 K) -\rho_B(10 K)$ was observed to be about 3 i-cm, which indicates that electron-phonon inelastic scattering was relatively weak compared to disordered elastic scattering.

The value of $\lambda_{eff}$ was observed to be smaller than the thickness and the grain size of the film by a factor of 5 to 10. β-W phase is stabilized by small amounts of oxygen. See, Petroff et al., *J. Appl. Phys.* 44, 2545 (1973); Narasimham, *AIP Advances* 4, 117139 (2014). Therefore, the finite-size effect and the grain boundary scattering are not sufficient to account for the large resistivity of the β-W film. Further, the small amounts of oxygen which are responsible for electron disordered scattering are associated either with charge-dependent impurity scattering or spin-orbit scattering. Based on the large spin Hall angle observed in β-W films, the disordered spin-orbit scattering plays a significant role in the resistivity of the β-W films. See, Pai et al., *Appl. Phys. Lest.* 101, 122404 (2012); Pai et al., *Appl. Phys. Lett.* 104, 082407 (2014); Hao et al., *Phys. Rev. Appl.* 3, 034009 (2015).

Above 22.1 nm, as shown in FIG. 8B, the resistivities were observed to have decreased significantly as calculated by Eq. (1). These thicker films have a small mixture of α-W phase, which has a smaller resistivity than β-W phase. For the annealed films, resistivity was observed to be in the range of 100-260 μΩ-cm for films that remained 1-W phase.

Example 7—Analysis of Temperature Dependence of Resistivity and Hall Effect

An investigation of the temperature dependence of resistivity and Hall effect provided insight into the β-W solid with a strong SOC. The Quantum Design Physical Property Measurement System was used to measure resistivity and Hall effect as functions of temperature between about 10 K and about 360 K.

FIG. 8A is a graph of the temperature dependence of the Hall effect in β-W and α-W thin films. After annealing, the 24.1 nm and 26.7 nm films were observed to have been transformed into α-W phase. For the 26.7 nm thick α-W thin film, ρ(300 K) was observed to have been about 40 μΩ-cm and ρ(10 K) was observed to be about 30 μΩ-cm. See, FIG. 8A. The resistivity of the α-W phase was observed to be more dependent on temperature compared with β-W. For example, the thermally induced resistivity, $\Delta\rho = \rho_B(300 K) - \rho_B(10 K)$ was observed to be 10 μΩ-cm for α-W film with a thickness of 26.7 nm, indicating a significant contribution from the electron-phonon scattering.

Figure 9:
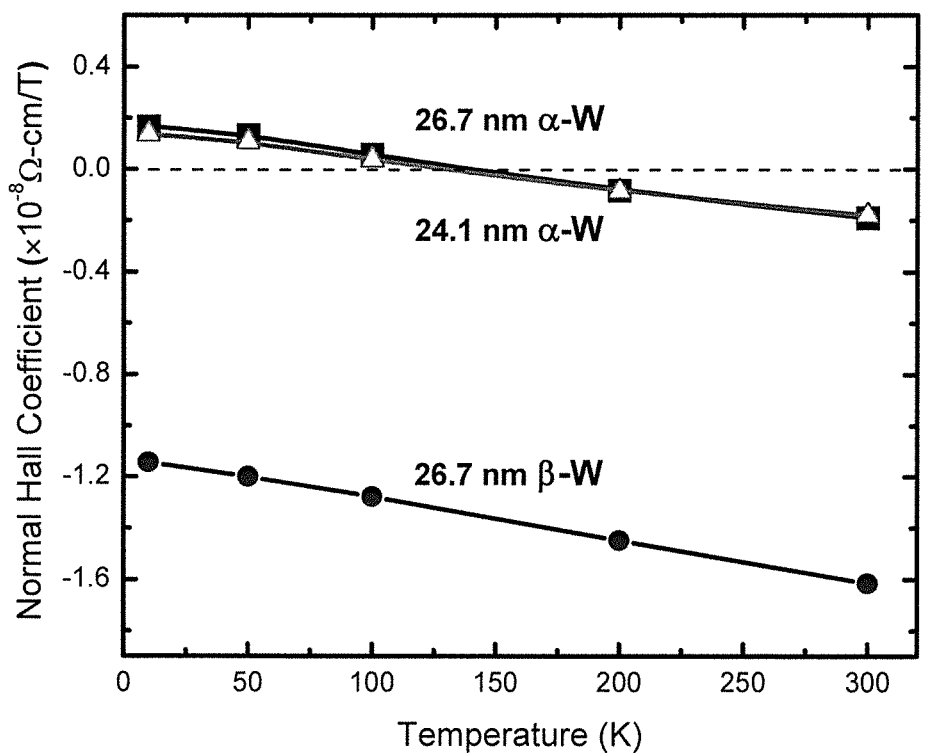
FIG. 9 is a line graph of temperature dependence of normal Hall coefficient of β-W at a thickness of 26.7 nm, and α-W at thicknesses of 24.1 nm and 26.7 nm. Normal spin Hall effect was measured between −5 T and +5 T. There is a sign change at about 130 K for α-W.

The normal Hall effect was measured which is an integral part of the electron transport of a metal. An investigation of both the resistivity and Hall effect and their temperature dependence provides insight into the (β-W solid with a strong SOC. FIG. 9 shows the temperature dependence of the Hall effect of the β-W and α-W thin films. The Hall coefficient, $R_H(300 K)$, for β-W thin film was observed to be $-1.62 \times 10^{-8}$ Ω-cm/T which is equal to $-1.62 \times 10^{-10}$ m$^3$/C. $R_H(T)$, carries a negative sign and is linearly dependent on temperature in the range of 10 K to 300 K. At 10 K, the magnitude of $R_H(10 K)$ was observed to be $-1.14 \times 10^{-8}$ Ω-cm/T, and which was observed to have been reduced by 30% from the room temperature value. Charge carriers are predominantly electrons in the β-W thin film. $R_H$ was observed to be about 5 times smaller than the bulk value; for example $R_H(300 K)$ was observed to be $+8.6 \times 10^{-11}$ m$^3$/C compared to a bulk value of $+11.8 \times 10^{-11}$ m$^3$/C. See, *Physical and Chemical Properties of the Elements*, edited by G. V. Samsonov (Naukova Dumka, Kiev, 1965); *AIP Handbook*, 3rd Ed., edited by Dwight E. Gray (American Institute of Physics, New York, 1972).

$R_H(T)$ for α-W thin films was observed to be linearly dependent on temperature. For α-W thin films, $R_H(300 K)$ was observed to be $-1.91 \times 10^{-9}$ Ω-cm/T which is equal to $-1.91 \times 10^{-11}$ m$^3$/C, consistent with prior studies of α-W thin films. See, Bastl, *Thin Solid Films* 10, 311-313 (1972). $R_H(T)$ was observed to change signs from negative to positive as temperature was reduced below 130 K, indicating a competition between electron and hole carriers from multi-bands in α-W thin films. The spin Hall effect data presented in FIG. 9 is evidence of the effects of band structure, scattering mechanisms, and surface electronic states of β-W and α-W thin films incorporating the strong SOC. Small amounts of oxygen in β-W or α-W thin films were observed to affect temperature dependence of the spin Hall effect.

Using sputtering methods herein, a layered structure in the form of W(t)/Co$_{40}$Fe$_{40}$B$_{20}$ (1.0 nm)/MgO(1.6 nm)/Ta (1.0 nm) was made. After annealing, Co$_{40}$Fe$_{40}$B$_{20}$ was observed to develop PMA as the W layer remained in β-phase. See, Hao et al., *Phys. Rev. Appl.* 3, 034009 (2015).

Figure 10:
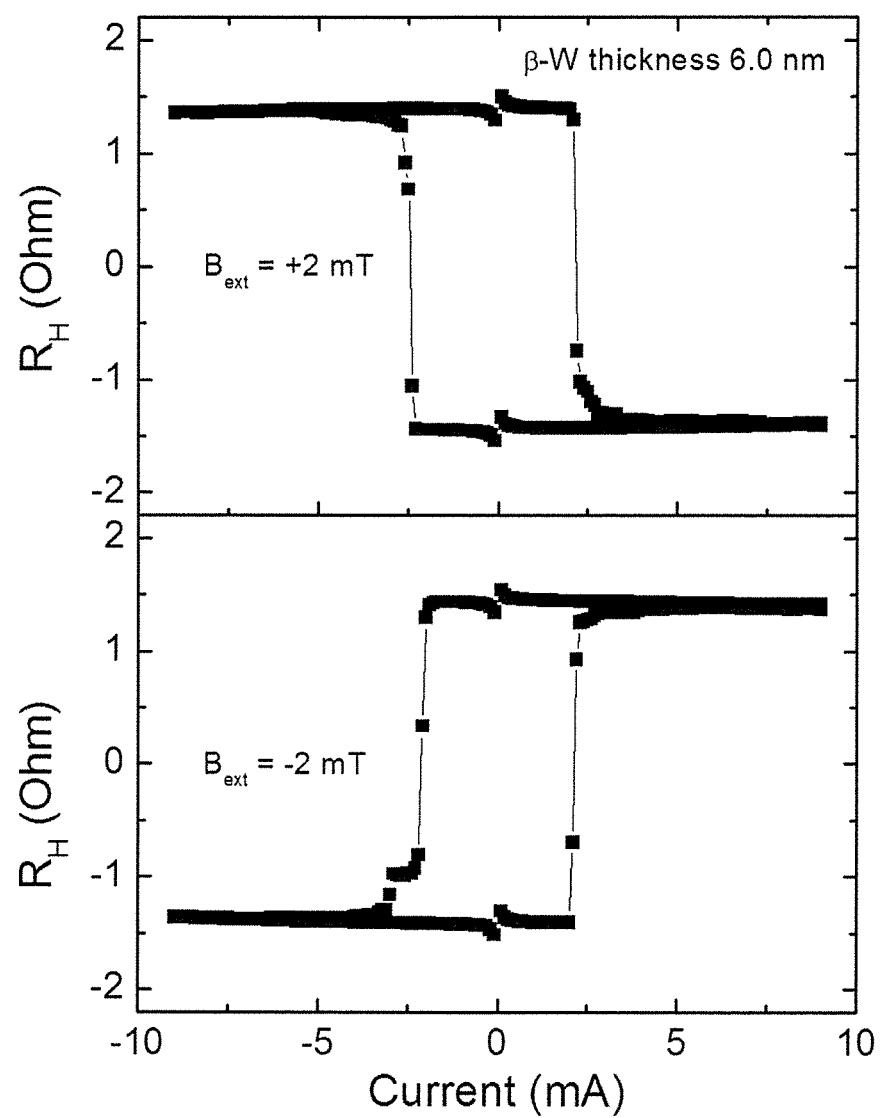
FIG. 10 is a plot of current-induced magnetic-switching curves in the W(6.0 nm)/$Co_{40}Fe_{40}B_{20}$ (1.0 nm)/MgO(1.6 nm)/Ta(1.0 nm) sample, under an in-plane magnetic field Ben of +/−2 mT (+ parallel, and − antiparallel to current direction). Magnetic switching in the PMA of the $Co_{40}Fe_{40}B_{20}$ layer was sensed by measuring the anomalous Hall voltage in the layer as current was applied to the Hall bar sample.

FIG. 10 is a graph of the magnetic switching of the Co$_{40}$Fe$_{40}$B$_{20}$ (1.0 nm) layer by the spin current generated in the β-W layer (6.0 nm). Switching was detected by measuring the anomalous Hall effect of the Co$_{40}$Fe$_{40}$B$_{20}$ (1.0 nm) layer. Under an in-plane magnetic field of 2 mT, the sample W(6.0 nm)/Co$_{40}$Fe$_{40}$B$_{20}$ (1.0 nm)/MgO(1.6 nm)/Ta (1.0 nm) was observed in FIG. 10 to be magnetically switched with a critical current ($I_c$) of 2.2 mA, corresponding to a critical current density ($J_C$) of $1.2 \times 10^6$ A/cm$^2$ in the W layer, about an order of magnitude smaller than those obtained in other similar structures. See, Pai et al., *Appl. Phys. Lett.* 104, 082407 (2014); Liu et al., *Science* 336, 555 (2012); Zhang et al., *J Appl. Phys.* 115, 17C714 (2014); Qiu et al., *Scientific Reports* 4, 4491 (2014); Liu et al., *Phys. Rev. Lett.* 109, 096602 (2012).

In general, β-W thin films that are embodiments of the invention provided herein were fabricated using a magnetron sputtering process. The as-deposited films were observed to be in β-W phase from 3.0 nm to 26.7 nm. In order to obtain PMA in layered structures of β-W/Co$_{40}$Fe$_{40}$B$_{20}$/MgO, high vacuum thermal magnetic annealing was performed at a temperature of 280° C. After annealing, β-W phase was observed to have been transformed into α-W phase at a critical thickness of greater than 22.1 nm, which is larger than the spin diffusion length of 3.5 nm for β-W thin films. The stabilization of β-W up to 22.1 nm after annealing was observed to be capable of exploiting the full GSHE in 1-W thin films. In the films provided herein, the typical grain size was observed to be about one third to one half of the thin film thickness. The room temperature resistivity of the bulk β-W film was observed to be about 195 μΩ-cm and the electron mean free path was observed to be about 0.45 nm.

The resistivity of β-W was observed to be nearly insensitive to factors of temperature and thickness. At 14.5 nm, the temperature coefficient of resistivity was observed to be almost zero in the range of 10 K to 360 K. This property is highly desirable for spintronics applications because the magnetic switching power from GSHE does not depend on temperature. The normal Hall coefficient for f-W thin films was measured between 10 K and 300 K. The Hall coefficient for the β-W thin films was observed to have the same magnitude as bulk α-W, and have a negative sign. Using the sputtering and magnetic thermally annealing process herein, PMA and low switching current density was observed in a layered structure of β-W/Co$_{40}$Fe$_{40}$B$_{20}$/MgO.

What is claimed is:

1. A method of fabricating a metastable thin film, the method comprising: cooling a substrate to a temperature less than ambient temperature for deposition; combining argon and oxygen to form a sputtering gas; and depositing onto the substrate the metastable thin film using the sputtering gas at a sputtering power up to 1000 W, and at a rate in a range of about 0.02 nm/s to about 10 nm/s.

2. The method according to claim 1, wherein the metastable thin film is β-firm tungsten.

3. The method according to claim 1, wherein cooling the substrate is to the temperature of liquid nitrogen.

* * * * *